United States Patent
Suzuki et al.

(10) Patent No.: US 6,470,312 B1
(45) Date of Patent: Oct. 22, 2002

(54) SPEECH CODING APPARATUS, SPEECH PROCESSING APPARATUS, AND SPEECH PROCESSING METHOD

(75) Inventors: Masanao Suzuki; Yasuji Ota, both of Kawasaki; Yoshiteru Tsuchinaga, Fukuoka, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/897,839

(22) Filed: Jul. 2, 2001

Related U.S. Application Data

(63) Continuation of application No. PCT/JP99/02089, filed on Apr. 19, 1999.

(51) Int. Cl.[7] .............................................. G10L 19/04
(52) U.S. Cl. ..................... 704/219; 704/220; 704/200.1
(58) Field of Search .................................. 704/219, 212, 704/214, 258, 264, 223, 208, 220, 205, 207, 262, 265, 200.1

(56) References Cited

U.S. PATENT DOCUMENTS

| 5,774,837 A | * | 6/1998 | Yeldener et al. ............ 704/206 |
| 5,809,456 A | * | 9/1998 | Cucchi et al. ............... 704/217 |
| 5,878,081 A | * | 3/1999 | Sluijter et al. .............. 375/242 |

FOREIGN PATENT DOCUMENTS

| JP | 05113800 | 5/1993 |
| JP | 09081184 | 3/1997 |
| JP | 09134196 | 5/1997 |

OTHER PUBLICATIONS

ICASSP–88. International Conference on Acoustics, Speech, and Signal Processing. Kleijn et al., Improved speech quality and efficient vector quantization in SELP. pp. 155–158 vol. 1, Apr. 1988.*

W.B. Klejin, et al. Improved Speech Quality and Efficient Vector Quantization in SELP. AT&T Bell Laboratories IEEE, 1998. pp. 155–158.

* cited by examiner

*Primary Examiner*—Richemond Dorvil
(74) *Attorney, Agent, or Firm*—Katten Muchin Zavis Rosenman

(57) ABSTRACT

The invention enables a source speech signal to be coded in an optimal way. An adaptive codebook (Ba) stores a series of signal vectors of a past speech signal. A vector extraction means extracts a signal vector and neighboring vectors adjacent thereto. A high-order long-term prediction synthesis filter produces a long-term predicted speech signal (Sna–1) from the signal vector and its neighboring vectors. A filter coefficients calculation means calculates filter coefficients of the long-term prediction synthesis filter. A perceptual weighting synthesis filter obtains a reproduced coded speech signal (Sna) from the long-term predicted speech signal (Sna–1). An error calculation means calculates the error (En) of the reproduced coded speech signal (Sna) with reference to the speech signal (Sn). A minimum error detection means finds a minimum error point that yields the smallest error among the calculated errors. An optimal value transmission means transmits optimal values including optimal filter coefficients (βa) and an optimal delay (La) which are the filter coefficients and the lag parameter at the minimum error point.

21 Claims, 18 Drawing Sheets

SPEECH CODING APPARATUS, SPEECH PROCESSING APPARATUS, AND SPEECH PROCESSING METHOD

This application is a continuation of PCT/JP99/02089 filed Apr. 19, 1999.

BACKGROUND OF THE INVENTION

(1) Field of the Invention

The present invention relates to a speech coding apparatus, a speech processing apparatus, and a speech processing method. More particularly, the present invention relates to a speech coding apparatus which encodes speech signals into lower bitrate signals (e.g., less than 4 kb/s) by applying Analysis-by-Synthesis (AbS) vector quantization techniques to source speech signals containing a plurality of periodic components within a fixed time interval, based on an appropriate speech production model. The present invention also relates to a speech processing apparatus and a speech processing method which performs speech coding with AbS vector quantization techniques, based on a speech production model.

(2) Description of the Related Art

The code-excited linear prediction (CELP) method has been known as a speech coding technique which encodes telephone voice signals with a spectrum ranging from 0.3 to 3.4 kHz into a bitstream with a rate of 4 to 16 kb/s. CELP is widely used in digital mobile communications systems and enterprise communications systems.

What CELP coders actually transmit are: linear predictive coding (LPC) coefficients representing resonance characteristics of the human vocal tract, and parameters representing excitation signals (sound source data) consisting of periodic pitch components and noise components. The CELP algorithm uses an LPC synthesis filter H(z) of equation (1) as a model of the human vocal tract, assuming that the input signal to that filter (sound source signal) can be divided into its periodic pitch components and noise components. The former components represent the periodicity of voices, while the latter the randomness.

$$H(z) = \frac{1}{1 - \sum_{i=1}^{p} \alpha_i \cdot z^{-i}} \quad (1)$$

Subsequently, the filter coefficients characterizing the LPC synthesis filter, as well as the pitch interval components and noise components of the excitation signal, are extracted and quantized. Here, data compression is accomplished by sending out the quantized data, i.e., quantization indices.

FIG. 18 depicts the CELP coding algorithm. Suppose that a source voice signal Sn is entered to an LPC analyzing means 21. Using an all-pole filter characterized by equation (1) representing the human vocal tract model, the LPC analyzing means 21 calculates the coefficient $\alpha_i$ (i=1 to p) of that all-pole filter, where p represents its order. Typically, the filter's order p ranges from 10 to 12 for phone-quality speech signals, while 16 to 20 for wideband speech signals.

The LPC filter coefficients are then quantized with scalar quantization or vector quantization techniques (quantizer not shown in FIG. 18). The resultant quantization indices are transmitted to the decoding end. The excitation signal is also quantized. For the quantization of its pitch interval components, the CELP algorithm employs an adaptive codebook Ba recording the past sound source signal series. For the quantization of noise components, the algorithm provides a noise codebook Bn storing various noise signal patterns.

The codebooks Ba and Bn are used in the A-b-s vector quantization process as follows. The process begins with a variable-gain multiplication of code vectors read out of the codebooks Ba and Bn. This operation is executed by multipliers 22a and 22b. The sum of the outputs of the multipliers 22a and 22b are calculated by an adder 23 and supplied to an LPC synthesis filter 24, whose response is defined by the LPC filter coefficients. With its filtering algorithm, the LPC synthesis filter 24 reproduces a signal Sn*. This reproduced speech signal Sn* is then subjected to an arithmetic operator 26 for the calculation of its error en with respect to the source speech signal Sn.

An error power evaluation means 25 evaluates the error en for every possible combination of code vectors read out of the two codebooks Ba and Bn, changing the positions of selection switches SWa and SWb from one to another. Through the error evaluation, the error power evaluation means 25 obtains one particular combination of code vectors which exhibit the smallest error value among others. This combination is referred to herein as the "optimal code vector pair," and the gain corresponding to the pair is referred to as the "optimal gain." Finally, a quantizer (not shown) quantizes the obtained optimal code vector pair and optimal gain, thereby yielding quantization indices.

That is, the coder produces quantization indices of LPC filter coefficients, of optimal code vectors, and of optimal gains. The quantization indices of the optimal code vectors actually include: those of the code vectors selected from the noise codebook Bn, and those of what will be explained later as "lag," i.e., a parameter used in extracting optimal vectors from the adaptive codebook Ba. Those quantization indices are transmitted to the decoding end.

The decoder obtains LPC filter coefficients, optimal code vector, and optimal gain by decoding the data received from the encoder. Employing the same codebooks Ba and Bn and LPC synthesis filter as those used at the encoding end, the decoder reproduces the original speech signal.

As described above, the CELP algorithm accomplishes speech compression by establishing a speech production process model and transmitting quantized characteristic parameters of that model. Since the characteristics of human voices exhibit little variation within a short time, e.g., 5 to 10 msec, the CELP algorithm updates vocal tract parameters and excitation parameters only at as short intervals as 5 to 10 msec. Such short time segments are referred to as "frames." This method permits the CELP coders to provide coded speech signals without quality deterioration at reduced bitrates as low as 5 to 6 kb/s.

The above-described conventional speech coding algorithm, however, cannot reduce the bitrate further for the following reason. For bitrates of 4 kb/s or lower, the conventional algorithm requires that the frame length be elongated to more than 10 ms. This means that a single frame of a source speech signal is likely to contain two or more different pitch components, introducing quality deterioration to the resultant coded speech signal.

In other words, the conventional CELP algorithm is weak in modeling the periodicity of a speech signal within a single frame because the periodicity of output signals contained in the adaptive codebook Ba is strictly confined to one component per frame. For this reason, the conventional algorithm is unable to capture the periodicity of a source speech signal precisely enough to provide high coding efficiency in the cases where one frame contains a plurality of periodic pitch components, which limits its coding efficiency.

SUMMARY OF THE INVENTION

In view of the foregoing, it is an object of the present invention to provide a speech coding apparatus which encodes given speech signals in an optimal way.

It is another object of the present invention to provide a speech processing apparatus which performs optimal speech processing according to a given source speech signal, so that the signal will be reproduced with high quality at the receiving end.

It is still another object of the present invention to provide a speech processing method which performs speech processing in an optimal way for a given source speech signal, so that the signal will be reproduced with high quality at the receiving end.

To accomplish the above first object, according to the present invention, there is provided a speech coding apparatus. This speech coding apparatus performs speech coding based on a speech production model, in which a given speech signal Sn is divided into fixed-length segments. This speech coding apparatus comprises the following elements: an adaptive codebook Ba which stores a series of signal vectors of a past speech signal; a vector extraction means for extracting a signal vector and neighboring vectors adjacent thereto from the adaptive codebook, the signal vector being stored at a distance given by a lag parameter L from the top entry location O of the adaptive codebook Ba; a long-term prediction synthesis filter with a high order which produces a long-term predicted speech signal Sna−1 from the signal vector and neighboring vectors by applying long-term prediction synthesis concerning the periodicity of the speech signal Sn; a filter coefficient calculation means for calculating filter coefficients of the long-term prediction synthesis filter; a perceptual weighting synthesis filter which processes the long-term predicted speech signal Sna−1 to yield a reproduced coded speech signal Sna, comprising: a linear predictive synthesis filter 14a defined through estimation with a linear predictive coding synthesis technique that emulates a vocal tract response, a first perceptual weighting filter which is coupled in series with the linear predictive synthesis filter and assigns perceptual weights to a signal supplied thereto according to characteristics of a human hearing system, an error calculation means for calculating the error En of the reproduced coded speech signal Sna with reference to the perceptually weighted speech signal Sn; a minimum error detection means for finding a minimum error point that yields the smallest error among those that the error calculation means has calculated while varying the lag parameter L; and an optimal value transmission means for transmitting optimal values including optimal filter coefficients βa and an optimal delay La, the optimal filter coefficients βa being the filter coefficients at the minimum error point, the optimal lag parameter La being the lag parameter at the minimum error point.

In operation, the adaptive codebook Ba stores a series of signal vectors of a past speech signal. The vector extraction means extracts a signal vector and neighboring vectors adjacent thereto from the adaptive codebook. Here, the signal vector is stored at a distance given by a lag parameter L from the top entry location O of the adaptive codebook Ba. The high-order long-term prediction synthesis filter produces a long-term predicted speech signal Sna−1 from the signal vector and neighboring vectors by applying long-term prediction synthesis concerning the periodicity of the speech signal Sn. The filter coefficient calculation means calculates the filter coefficients of the long-term prediction synthesis filter. The perceptual weighting synthesis filter 14 processes the long-term predicted speech signal Sna−1 to yield a reproduced coded speech signal Sna. This perceptual weighting synthesis filter comprises the following elements: the linear predictive synthesis filter 14a defined through estimation with a linear predictive coding synthesis technique that emulates a vocal tract response, the first perceptual weighting filter which is coupled in series with the linear predictive synthesis filter and assigns perceptual weights to a signal supplied thereto according to characteristics of a human hearing system, and the second perceptual weighting filter which produces a perceptually weighted speech signal by assigning perceptual weights to the speech signal Sn. The error calculation means calculates the error En of the reproduced coded speech signal Sna with reference to the perceptually weighted speech signal Sn'. The error calculation means repeatedly executes this calculation while varying the lag parameter L. The minimum error detection means finds a minimum error point that yields the smallest error among the calculated errors. The optimal value transmission means transmits optimal values including optimal filter coefficients βa and an optimal delay La. The optimal filter coefficient βa and optimal lag parameter La are the filter coefficients and lag parameter at the minimum error point.

In addition to the above, there is provided a speech processing apparatus, which performs speech analysis and synthesis based on a speech production model. This speech processing apparatus comprises the following elements: (a) a speech coding processor comprising: (a1) a first speech coding means for producing coded data by coding a speech signal when at most one periodic component is contained in a fixed-length segment of the speech signal; and (a2) a second speech coding means comprising:

(a2a) an adaptive codebook which stores a series of signal vectors of a past speech signal for use in such cases where the fixed-length segment contains a plurality of periodic components; (a2b) a vector extraction means for extracting a signal vector and neighboring vectors adjacent thereto from the adaptive codebook, the signal vector being stored at a distance given by a lag parameter from the top entry location of the adaptive codebook; (a2c) a long-term prediction synthesis filter with a high order which produces a long-term predicted speech signal from the signal vector and the neighboring vectors by applying long-term prediction synthesis concerning the periodicity of the speech signal; (a2d) a filter coefficient calculation means for calculating filter coefficients of the long-term prediction synthesis filter; (a2e) a perceptual weighting synthesis filter which processes the long-term predicted speech signal to yield a reproduced coded speech signal, comprising: (a2e1) a linear predictive synthesis filter defined through estimation with a linear predictive coding synthesis technique that emulates a vocal tract response, and (a2e2) a first perceptual weighting filter which is coupled in series with the linear predictive synthesis filter and assigns perceptual weights to a signal supplied thereto according to characteristics of a human hearing system; (a2f) a second perceptual weighting filter which produces a perceptually weighted speech signal by assigning perceptual weights to the speech signal; (a2g) an error calculation means for calculating an error of the reproduced coded speech signal with reference to the perceptually weighted speech signal; (a2h) a minimum error detection means for finding a minimum error point that yields the smallest error among those that the error calculation means has calculated while varying the lag parameter; and (a2i) an optimal value transmission means for transmitting optimal values including optimal filter coefficients and an optimal delay, the optimal filter coefficients being the filter coefficients at the minimum error point, the optimal lag parameter being the lag parameter at the minimum error point; and (b) a speech decoding processor, comprising: (b1) a first speech decoding means for reproducing the speech signal by decoding the coded data; and (b2) a second speech decoding means for reproducing the speech signal by decoding the optimal values.

In operation, the first speech coding means produces coded data by coding a speech signal in such cases where a fixed-length segment of the speech signal contains at most one periodic component. The first speech decoding means reproduces the speech signal by decoding the coded data. The second speech decoding means reproduces the speech signal by decoding optimal values.

Furthermore, there is provided a speech processing method, which performs speech analysis and synthesis based on a speech production model. This method comprises the following steps: providing an adaptive codebook which stores a series of signal vectors of a past speech signal; producing coded data by coding a speech signal when at most one periodic component is contained in a fixed-length segment of the speech signal; extracting a signal vector and neighboring vectors adjacent thereto from the adaptive codebook for use in such cases where the fixed-length segment contains a plurality of periodic components, the signal vector being stored at a distance given by a lag parameter from the top entry location of the adaptive codebook; producing a long-term predicted speech signal from the signal vector and the neighboring vectors by using a long-term prediction synthesis filter with a high order to apply long-term prediction synthesis concerning the periodicity of the speech signal; calculating filter coefficients of the long-term prediction synthesis filter; obtaining a reproduced coded speech signal from the long-term predicted speech signal through combined use of a linear predictive synthesis filter defined through estimation with a linear predictive coding synthesis technique that emulates a vocal tract response and a perceptual weighting filter which assigns perceptual weights according to characteristics of a human hearing system; calculating an error of the reproduced coded speech signal with reference to the speech signal; finding a minimum error point that yields the smallest error among those that said step of calculating the error has calculated for various values of the lag parameter; transmitting optimal values including optimal filter coefficients and an optimal delay which are the filter coefficients and the lag parameter at the minimum error point; and reproducing the speech signal by decoding the coded data or the optimal values.

In operation, the proposed speech processing method processes a given speech signal with two algorithms. One algorithm encodes the speech signal to produce coded data when at most one periodic component is contained in a fixed-length segment of the speech signal. The other algorithm, which is activated when a plurality of periodic components are included in a fixed-length segment of the speech signal, executes speech coding with a high-order LTP synthesis filter that is obtained through estimation with a long-term predictive analysis and synthesis techniques, thereby yielding optimal values. At the decoding end, such resultant coded data and optimal values are decoded accordingly.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
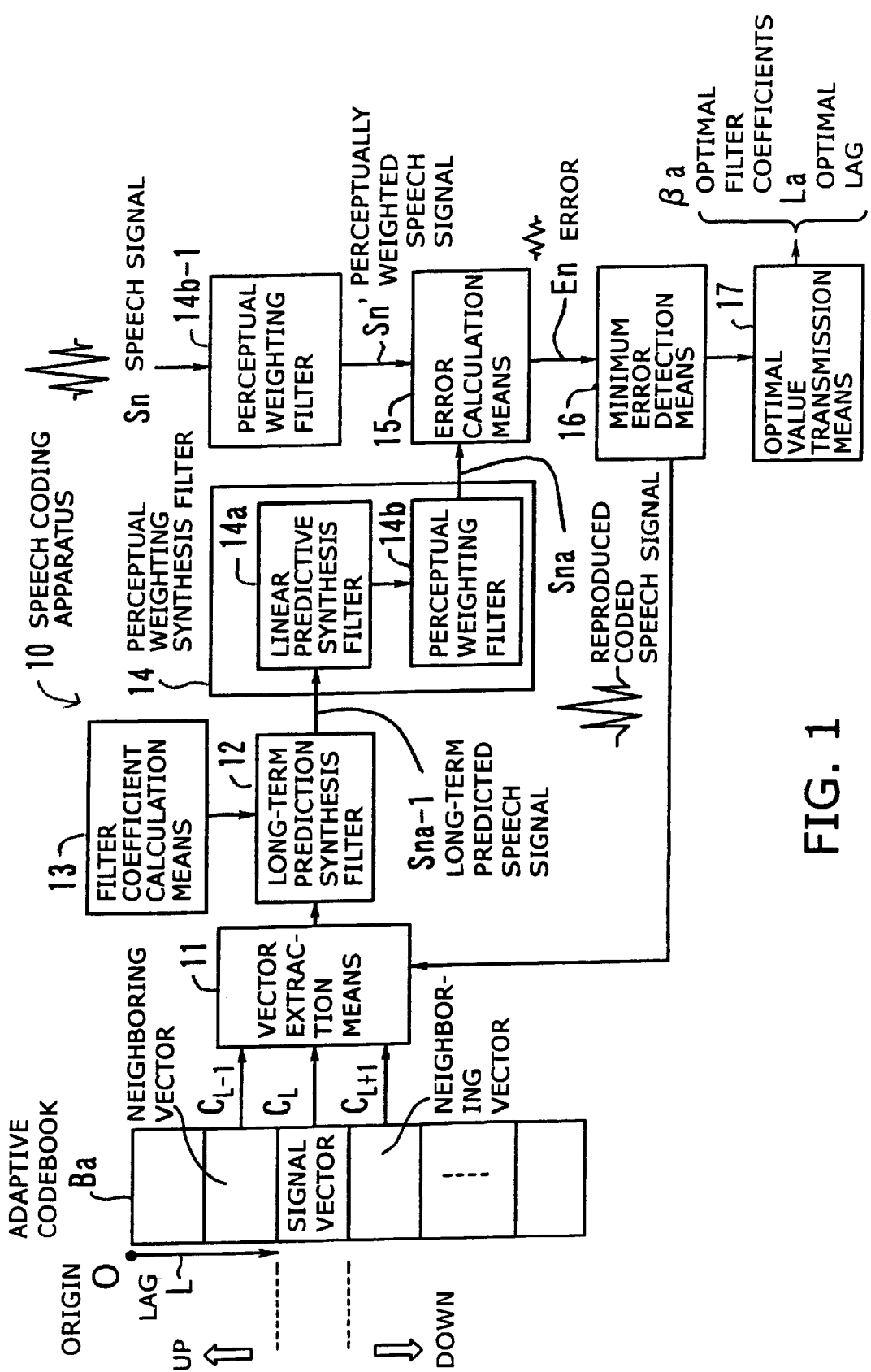
FIG. 1 is a conceptual view of a speech coding apparatus according to the present invention.

Preferred embodiments of the present invention will be described below with reference to the accompanying drawings. FIG. 1 is a conceptual view of a speech coding apparatus according to the present invention. This speech coding apparatus 10 is designed to perform speech coding operations in which a given speech signal Sn is divided into fixed-length time segments (or frames for bitrates of 4 kb/s or slower) and an appropriate speech production model is applied to such time segments containing a plurality of periodic components.

The second speech coding means 10 employs an adaptive codebook Ba which stores a series of signal vectors (code vectors) of the past speech signal Sn, each vector containing data for one frame. A vector extraction means 11 extracts a signal vector, as well as neighboring vectors adjacent thereto, from the adaptive codebook Ba. This signal vector is stored at a distance L from the top entry location, or origin, O of the adaptive codebook Ba. While FIG. 1 illustrates two neighboring vectors being extracted from the locations immediately above and below the signal vector $C_L$, it is not intended to limit the invention to this specific configuration. Alternatively, the vector extraction means 11 may extract more than two such vectors as neighboring vectors. Or it may extract from the adaptive codebook Ba only a single signal vector located immediately above or below the signal vector CL.

A high-order long-term prediction (LTP) synthesis filter 12 performs LTP synthesis processing with the extracted signal vector and neighboring vectors to analyze the periodicity in the speech signal Sn, thereby yielding a long-term predicted speech signal Sna−1. A filter coefficient calculation means 13 calculates the coefficients of that long-term prediction synthesis filter 12.

A perceptual weighting synthesis filter 14 comprises a linear predictive synthesis filter 14a (hereafter, "LPC synthesis filter 14a") and a first perceptual weighting filter 14b. The LPC synthesis filter 14a is defined through estimation with a linear predictive coding (LPC) synthesis technique that emulates the vocal tract response. Being placed before or after the LPC synthesis filter 14a, the first perceptual weighting filter 14b assigns perceptual weights to its input signal according to the characteristics of the human hearing system. With these two components, the perceptual weighting synthesis filter 14 reproduces a speech signal from the long-term predicted speech signal Sna−1, thus yielding a reproduced coded speech signal Sna.

A second perceptual weighting filter 14b-1 assigns perceptual weights to the speech signal Sn. An error calculation means 15 calculates the error En of the reproduced coded speech signal Sna with reference to the perceptually weighted speech signal Sn'. Actually, this error calculation means 15 calculates error values for various lag values L. A minimum error detection means 16 finds a minimum error point that yields the smallest error value among the error values calculated by the error calculation means 15. The filter coefficients and lag parameter at the minimum error point are referred to as the "optimal filter coefficients" βa and "optimal lag" La, respectively. These optimal values are sent out by an optimal value transmission means 17. Note that the optimal value transmission means 17 quantizes the optimal filter coefficients βa when transmitting them.

The following section explains more about the long-term prediction synthesis filter 12. This filter 12 and its coefficients will be referred to hereafter as the "LTP synthesis filter" 12 and the LTP filter coefficients, respectively. Equation (2) represents the transfer function P(z) of the LTP synthesis filter 12.

$$P(z) = \frac{1}{1 - \sum_{i=-J_1}^{J_2} \beta_i \cdot z^{-(L-i)}} \quad (2)$$

where $J_1$ is one of the two neighboring vector locations adjacent to the signal vector $C_L$; $J_2$ is the opposite location; z represents the delay operator; i is an integer; βi (i=−$J_1$ ..., $J_2$) represents the LTP filter coefficients; and L is the lag parameter. There is a relationship of p=$J_1$+$J_2$+1, where p is the order of the LTP synthesis filter 12.

Figure 2:
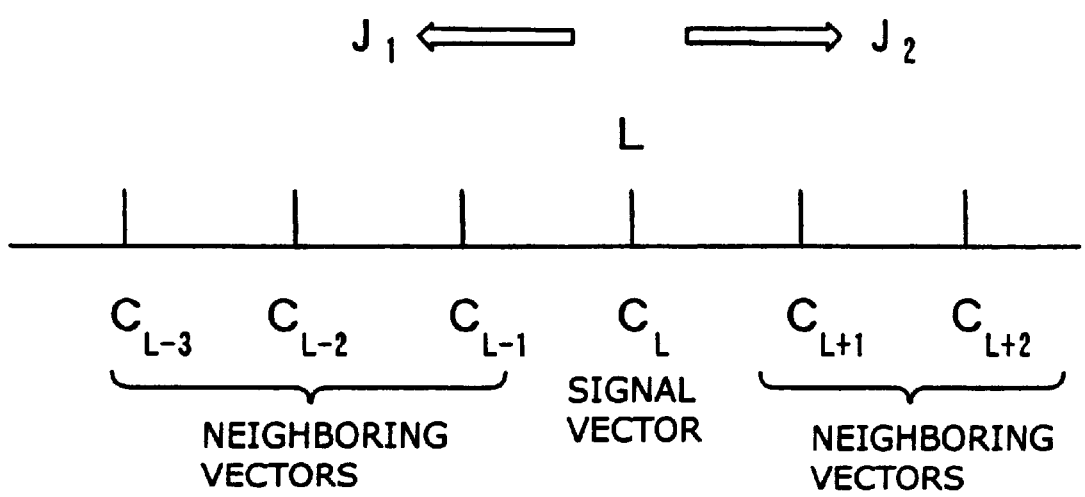
FIG. 2 is a diagram which shows the order of an LTP synthesis filter.

FIG. 2 is a diagram showing the order of the LTP synthesis filter 12, where the signal vector $C_L$ has a lag L, and the neighboring vector locations $J_1$ and $J_2$ are measured relative to $C_L$ in the left and right directions of FIG. 2, respectively. As FIG. 2 shows, there are three neighboring vectors $C_{L-1}$, $C_{L-2}$, and $C_{L-3}$ arranged in the direction $J_1$, as are other two vectors $C_{L+1}$ and $C_{L+2}$ arranged in the opposite direction $J_2$. Because $J_{1=3}$ and $J_{2=2}$ in this case, the filter's order p is calculated as p=3+2+1=6. What are extracted from the adaptive codebook Ba include the following vectors: signal vector $C_L$ with a lag L, upper neighboring vectors $C_{L-3}$, $C_{L-2}$, and $C_{L-3}$ located above the signal vector $C_L$, and lower neighboring vectors $C_{L+1}$ and $C_{L+2}$ below the signal vector $C_L$.

As an alternative to the above, the LTP synthesis filter 12 may have a transfer function P(z) of equation (3).

$$Pa(z) = \frac{1}{1 - \sum_{i=1}^{J_3} \beta_i \cdot z^{-i \cdot L}} \quad (3)$$

where $J_3$ represents the neighboring vector location relative to the signal vector; z represents the delay operator; i is an integer; βi (i=1 to $J_2$) represents LTP filter coefficients; and L is the lag parameter. Neighboring vectors are extracted from one side of the signal vector $C_L$ in this case, the order p of the LTP synthesis filter 12 is P=1+$J_3$.

Figure 3:
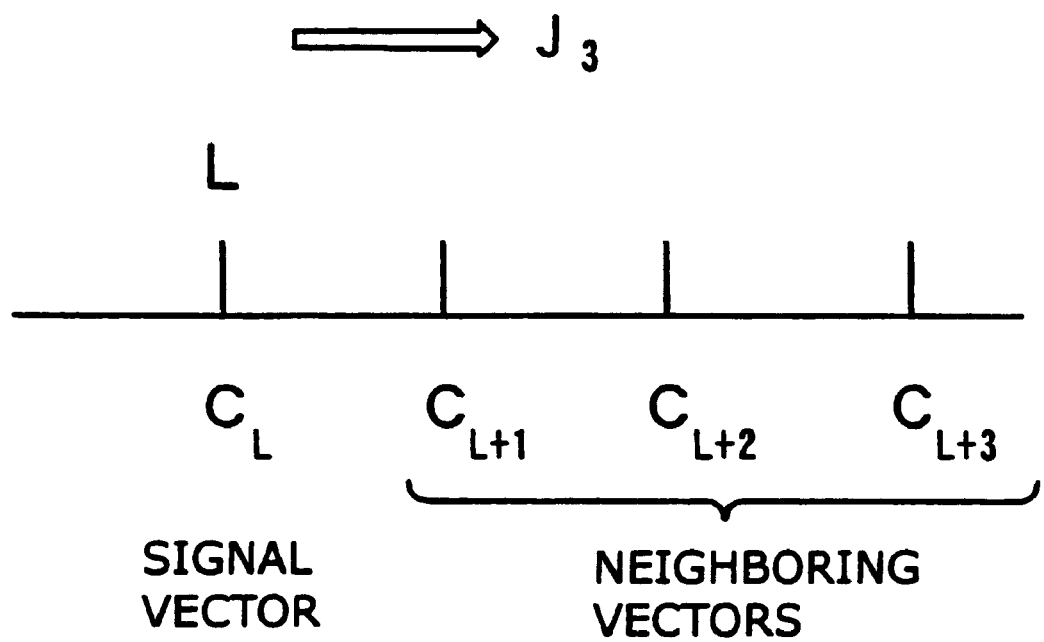
FIG. 3 is another diagram which shows the order of an LTP synthesis filter.

FIG. 3 is a diagram which shows the order of such an LTP synthesis filter 12, where the signal vector $C_L$ has a lag L, and the neighboring vector location $J_3$ is measured relative to $C_L$ in the right direction of FIG. 3. As FIG. 3 shows, there are three neighboring vectors $C_{L+1}$, $C_{L+2}$, and $C_{L+3}$ arranged in the direction $J_3$. Because $J_3$=3 in this case, the filter order p is calculated as p=1+3=4. What are extracted from the adaptive codebook Ba include the signal vector $C_L$ with a lag L and three neighboring vectors $C_{L+1}$, $C_{L+2}$, and $C_{L+3}$ located below the signal vector $C_L$. While further explanation will be discussed assuming the former transfer function P(z), the same will be applied to the case of the latter transfer function Pa(z).

The speech coding apparatus 10 identifies a particular set of LTP filter coefficients $\beta_i$ and lag parameter L that minimize the error evaluation function given by the following equation (4).

$$E^2 = \left| X - \sum_{i=-J_1}^{J_2} \beta_i \cdot H \cdot C_{L-i} \right|^2 \quad (4)$$

where X is a reference signal vector (i.e., a source speech signal vector entered when calculating an error); H represents the impulse response vector of the LPC synthesis filter 14a; and $C_L$ is the signal vector extracted from the adaptive codebook Ba with a lag value of L. Notation |A| refers to the absolute value of A.

For simplicity, it is assumed here that the order p is 3 (specifically, signal vector $C_L$ and its two neighboring vectors $C_{L-1}$ and $C_{L+1}$). Then equation (4) is rewritten to equation (5).

$$E^2 = |X - \beta_{-1} \cdot H \cdot C_{L-1} - \beta_0 \cdot H \cdot C_L - \beta_{+1} \cdot H \cdot C_{L+1}|^2 \quad (5)$$

Calculation of the partial differential of equation (5) with respect to $\beta_i$ will yield equation (6), where $A^T$ refers to the transpose of a matrix A.

$$\begin{pmatrix} (HC_{L-1})^T HC_{L-1} & (HC_{L-1})^T HC_L & (HC_{L-1})^T HC_{L+1} \\ (HC_L)^T HC_{L-1} & (HC_L)^T HC_L & (HC_L)^T HC_{L+1} \\ (HC_{L+1})^T HC_{L-1} & (HC_{L+1})^T HC_L & (HC_{L+1})^T HC_{L+1} \end{pmatrix} \begin{pmatrix} \beta_{-1} \\ \beta_0 \\ \beta_{+1} \end{pmatrix} = \quad (6)$$

$$\begin{pmatrix} (HC_{L-1})^T X \\ (HC_L)^T X \\ (HC_{L+1})^T X \end{pmatrix}$$

Let R and β be the 3×3 and 1×3 matrices shown on the left-hand side of equation (6), and r be the matrix on the right-hand side. Then the following equation (7) is obtained.

$$R\beta = r \quad (7)$$

This means that the LTP coefficient vector β can be calculated by the following equation (8), where $R^{-1}$ represents the inverse of the matrix R.

$$\beta = R^{-1} r \qquad (8)$$

While the order p of the LTP filter coefficients has been assumed to be three, the above explanation holds for any other positive values of p.

Figure 4:
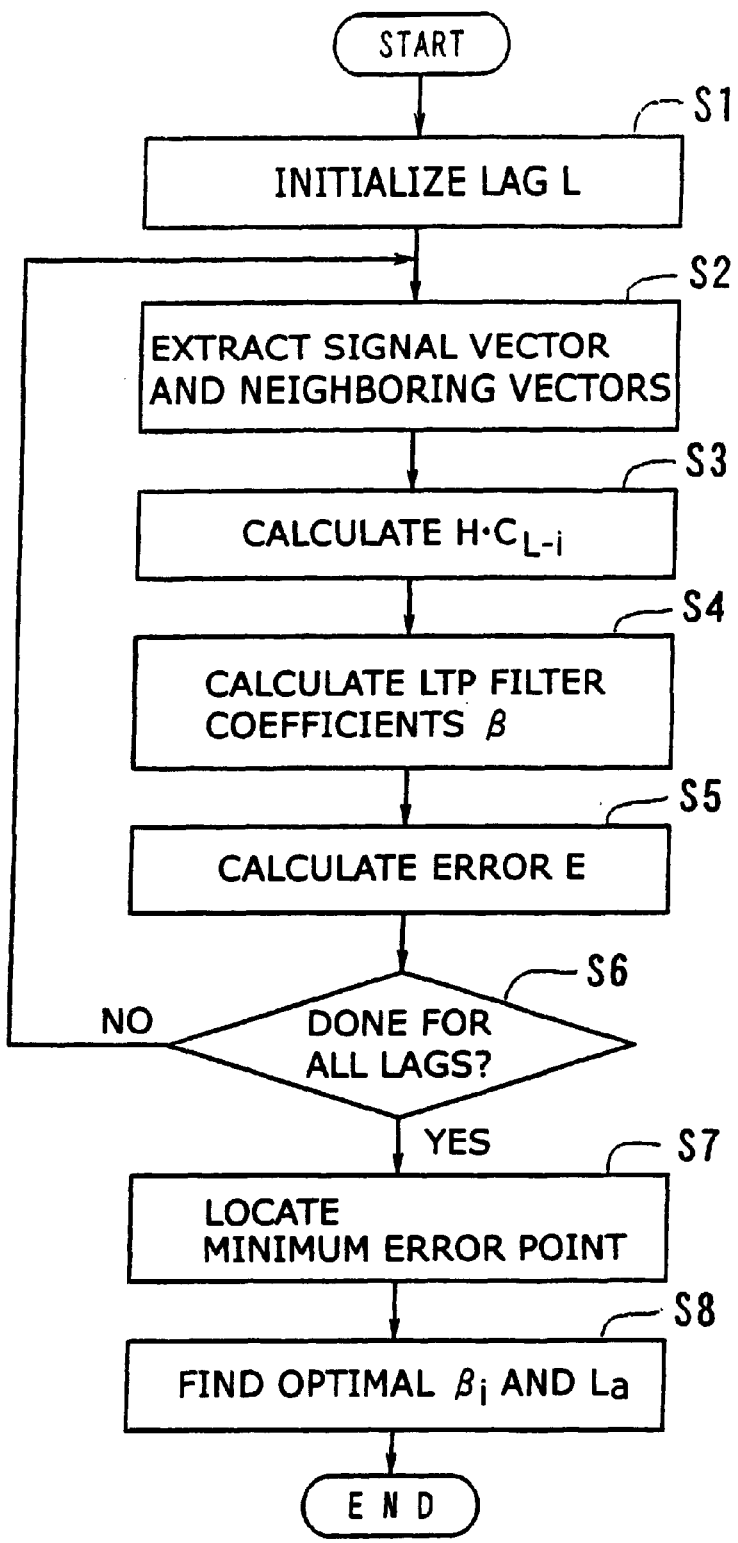
FIG. 4 is a flowchart of a procedure which searches for optimal LTP filter coefficients and optimal lag parameter.

Referring next to the flowchart of FIG. 4, the following section will explain how to search for the optimal filter coefficients (optimal LTP filter coefficients) βa and optimal lag La.

(S1) An initial value is set to the lag parameter L.

(S2) A signal vector with a lag L and its neighboring vectors $C_{L-i}$ ($i = -J_1$ to $J_2$) are extracted from the adaptive codebook Ba.

(S3) $H \cdot C_{L-i}$ is calculated through weighted synthesis processing for $C_{L-i}$.

(S4) Equation (8) is solved with $H \cdot C_{L-i}$ and X to yield an LTP filter coefficient vector β.

(S5) By evaluating equation (4) with the value of β obtained at step S4, the error E for lag L is calculated.

(S6) The lag parameter L is varied. If the above steps have been executed exhaustively for every possible value of L, then the process advances to step S7. Otherwise, the process returns to step S2 for another iteration of the steps to calculate the error and LTP filter coefficients β for the varied lag L.

(S7) The point that yields the minimum error value is located among all the calculated error values E.

(S8) The LTP filter coefficients and lag parameter L at the minimum error point are now identified as the optimal LTP filter coefficients βa and optimal lag La, respectively.

In the above process, the lag parameter L may vary within an arbitrary range. Typically, the range is 20 to 147 in the case where the source signal is sampled at the frequency of 8 kHz. While the apparatus employs an adaptive codebook Ba as the source of vectors exciting the LTP synthesis filter 12, other types of vector sources may also be used. More specifically, they may be white noise vectors, or other noise vectors that have been previously obtained through a learning process.

The above has explained the speech coding means 10 according to the present invention which employs LTP synthesis and LPC synthesis techniques to encode speech signals. Conventional CELP techniques are targeted to speech signal bitrates of 4 to 16 kb/s, which allows the use of as short frame lengths as 5 msec to 10 msec in encoding voices. This assumption permits them to satisfy the speech quality requirements by simply extracting a single signal vector from the adaptive codebook Ba and performing LPC synthesis. That is, each frame to be processed is so short that it can contain only one periodic component at most, which permits the periodicity of a speech signal to be expressed or reproduced by using only a single signal vector read out of the adaptive codebook Ba for each frame.

On the other hand, when a lower speech signal bitrate (e.g., 4 kb/s or lower) is required, the frame has to be elongated to 10 msec or more, increasing the likelihood that multiple periodic components are contained in a single frame. The presence of such multiple periodic components makes it difficult for the conventional CELP or LTP synthesis algorithms to emulate the periodicity of a speech signal satisfactorily with the information that the adaptive codebook Ba supplies by reading out a single signal vector per frame. This means that the accuracy of coding would be degraded.

The present invention solves the above problem as follows. The proposed speech coding apparatus 10 is configured to extract not only a signal vector, but also several neighboring vectors around the signal vector from its adaptive codebook Ba, when a plurality of periodic components are included in a single frame. The apparatus 10 then performs long-term predictive synthesis by entering the extracted vectors to the LTP filter 12, and after that, it performs through LTP synthesis to yield a coded speech signal. This configuration enables long frames containing multiple periodic components to be encoded without losing the information on the periodicity of the original speech signal, resulting in an improved accuracy in speech coding.

Figure 5:
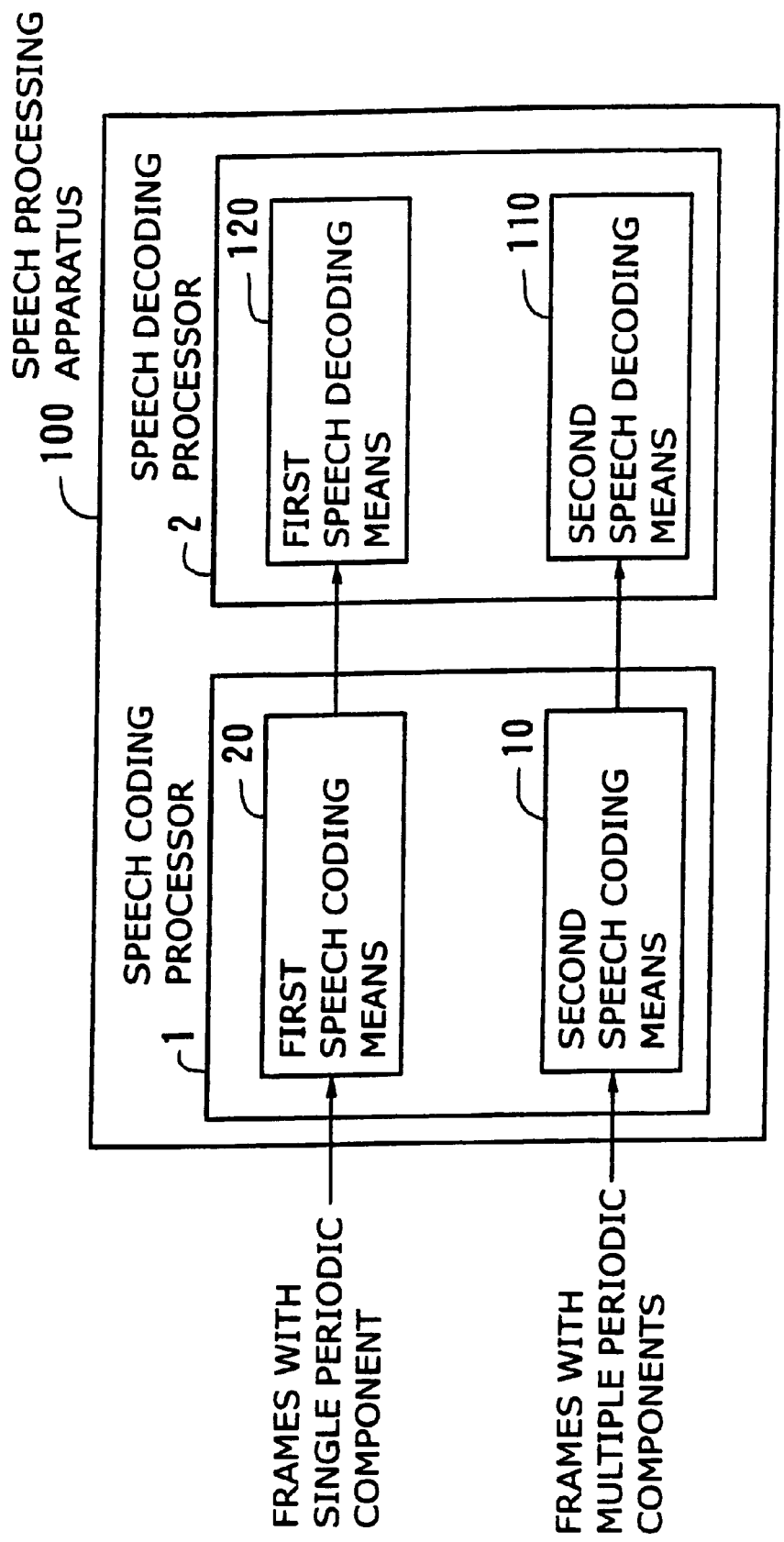
FIG. 5 is a conceptual view of a speech processing apparatus.

The next section will now describe a speech processing apparatus according to the present invention. FIG. 5 shows a conceptual view of the proposed speech processing apparatus. This speech processing apparatus 100 comprises a speech coding processor 1 and a speech decoding processor 2.

The speech coding processor 1 comprises a first speech coding means 20 and a second speech coding means 10. A given speech signal is divided into fixed-length segments (i.e., frames) for processing purposes. When a frame contains at most one periodic component, the first speech coding means 20 performs speech coding for that frame and output the coded data. Since this first speech coding means 20 actually serves as a CELP coding processor, the operation mode in which the first speech coding means 20 is activated is referred to hereafter as the "CELP mode."

The second speech coding means 10, on the other hand, performs speech coding when a given frame contains a plurality of periodic components. Since this second speech coding means 10 is equivalent to what was described earlier as the speech coding apparatus 10, no further details will be presented here. The operation mode in which the second speech coding means 10 is activated is referred to hereafter as the "LTP mode."

The speech decoding processor 2 comprises a first speech decoding means 120 and a second speech decoding means 110. The first voice decoding means 120 reproduces the original speech signal by decoding the coded data. More specifically, the first speech decoding means 120 decodes the speech data that has been produced in CELP mode at the coding end.

The second speech decoding means 110, on the other hand, reproduces the original speech signal by decoding the optimal values produced by the second speech coding means 10. That is, it decodes the speech data that has been produced in LTP mode at the coding end. A later section will explain more about the speech decoding processor 2, with reference to FIGS. 15 and 16.

Figure 6:
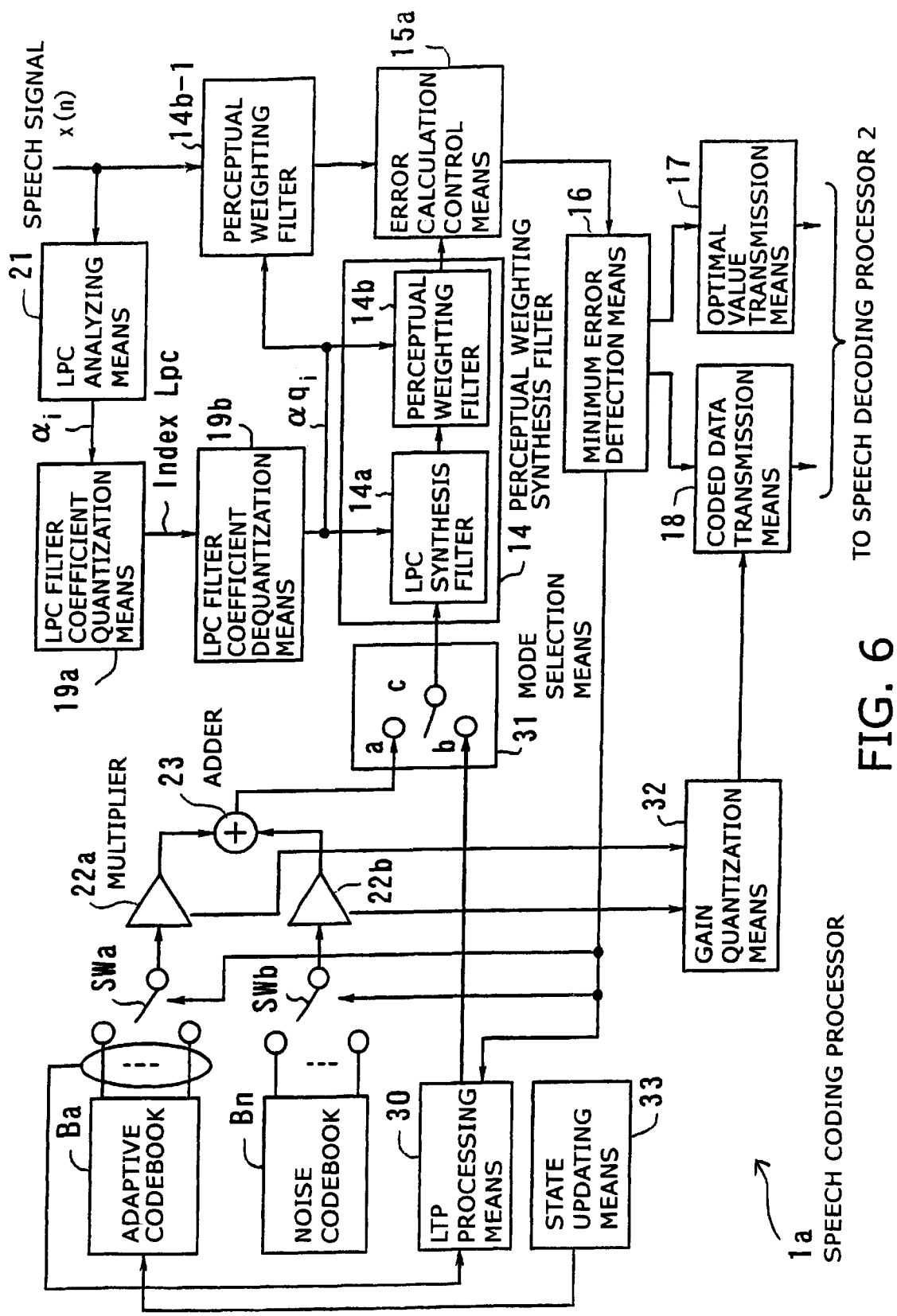
FIG. 6 is a diagram which shows the structure of a first embodiment of the present invention.

A first embodiment of the speech coding processor 1 will now be described below. FIG. 6 is a diagram which shows the structure of the first embodiment.

Figure 18:
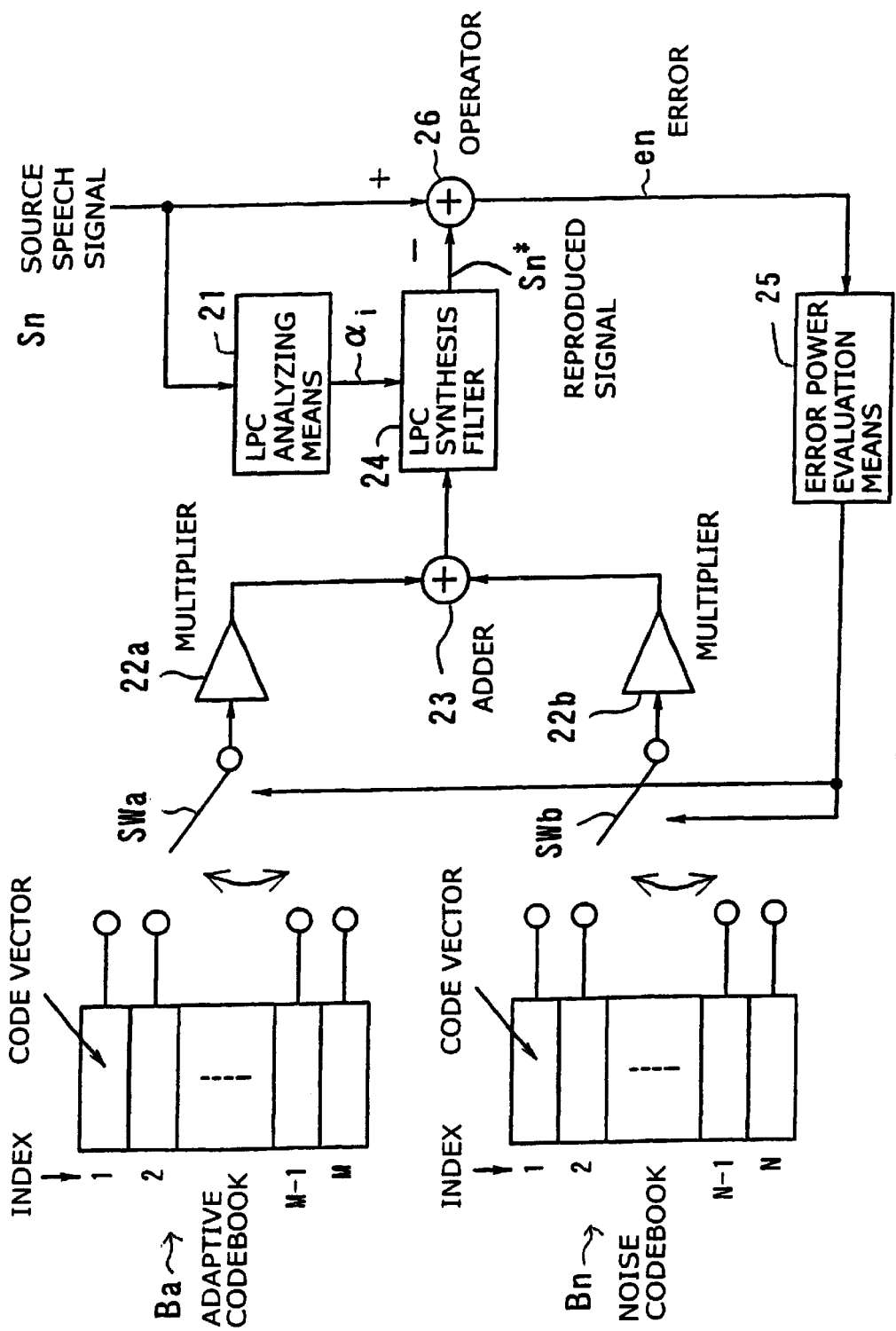
FIG. 18 is a diagram which shows the CELP coding algorithm.

According to the first embodiment of the invention, a speech coding processor 1a comprises a CELP coding processor (i.e., the first speech coding means 20) chiefly shown in FIG. 18 and a speech coding apparatus 10 (i.e., the second speech coding means 10) shown in FIG. 1. The speech coding processor 1a contains several components that have already been explained in earlier sections. For this reason, the explanation of those components will not be presented, while assigning the same reference numerals to them.

The speech coding processor 1a divides a source speech signal x(n) into fixed-length frames to perform speech coding on a frame-by-frame basis, N representing the length of each frame. The following section will first explain an LPC analyzing means 21, an LPC filter coefficient quantization means 19a, and an LPC filter coefficient dequantization means 19b, which are used in both CELP mode and LTP mode.

The LPC analyzing means 21 calculates mth-order LPC coefficients $\alpha_i$ (i=1 to m) through LPC analysis for the source speech signal x(n) where n=0 to N−1. The LPC filter coefficient quantization means 19a calculates quantized indices "Index Lpc" by quantizing $\alpha_i$. The LPC filter coefficient dequantization means 19b dequantizes the quantized indices "Index Lpc," thereby yielding dequantized values $\alpha q_i$. That is, the LPC filter coefficients are reproduced at the coding end in the same way as they are reproduced at the decoding end. The dequantized values $\alpha q_i$ are supplied to the LPC synthesis filter 14a and perceptual weighting filters 14b and 14b-1.

The transfer function H(z) of the LPC synthesis filter 14a is given by the following equation (9).

$$H(z) = \frac{1}{1 - \sum_{i=1}^{m} \alpha q_i \cdot z^{-i}} \quad (9)$$

While other types of filter models may also be applicable, the perceptual weighting filters 14b and 14b-1 are given by the following equation (10), for example, where $\gamma_1$ and $\gamma_2$ are weighting parameters.

$$W(z) = \frac{1 - \sum_{i=1}^{m} \gamma_1^i \cdot \alpha_i \cdot z^{-i}}{1 - \sum_{i=1}^{m} \gamma_2^i \cdot \alpha_i \cdot z^{-i}} \quad (10)$$

Because the perceptual weighting synthesis filter 14 is a series connection of H(z) and W(z), its response is represented as H(z)·W(z).

In CELP mode, a gain quantization means 32 quantizes the optimal gains determined as a result of searching the adaptive codebook Ba and noise codebook Bn, using any quantization techniques such as scalar quantization or vector quantization. The coded data, including optimal gains in CELP mode, is transmitted to the speech decoding processor 2 by a coded data transmission means 18, the details of which will be described later in FIG. 9.

In LTP mode, the speech coding processor 1a will operate as follows. The LTP mode is distinctive in that a high-order LTP synthesis filter and an LPC synthesis filter are used for coding the source signal. Also, the LTP processing means 30 shown in FIG. 6 actually includes a vector extraction means 11, an LTP synthesis filter 12, and a filter coefficient calculation means 13. Note here that the equation (2) is applicable to the transfer function P(z) of the LTP synthesis filter 12 being employed in the LTP processing means 30.

First, a signal vector $C_L$ with a lag L is extracted from the adaptive codebook Ba. The coefficients $\beta_i$ (i=1 to p) of the LTP synthesis filter are then obtained by solving the foregoing equation (8) with the extracted $C_L$ and the impulse response h(n) (n=0 to I−1) of the perceptual weighting synthesis filter 14, where I denotes the truncated order of the impulse response.

The greater the order p of the LTP synthesis filter 12 is, the higher the quality of coded voice signal becomes. However, more data bits are produced in the quantization process as the filter order increases. It is therefore necessary to choose an appropriate value for the order p, taking into consideration the tradeoff between speech quality and bitrate.

The LTP processing means 30 then produces a sound source signal (i.e., what has been explained in FIG. 1 as the long-term predicted speech signal Sna−1) by entering the extracted $C_L$ to the LTP synthesis filter 12 configured with coefficients $\beta_i$. This sound source signal is supplied to the perceptual weighting synthesis filter 14, thereby yielding a reproduced speech vector (i.e., what has been explained in FIG. 1 as the reproduced coded speech signal Sna). Subsequently, the error calculation control means 15a calculates weighted square error E between the reproduced speech vector and source speech signal, based on equation (4). (In CELP mode, the error calculation control means 15a uses another error evaluation function dedicated for CELP mode.)

After repeating the above processing for a predetermined range of lag L (e.g., $20 \leq L \leq 147$), the minimum error detection means 16 locates the minimum error point that yields the smallest error value E. The optimal value transmission means 17 then supplies the speech decoding processor 2 with the optimal LTP filter coefficients $\beta a$ and optimal lag La obtained at the minimum error point.

The speech coding processor 1a employs a mode selection means 31 which controls switching between CELP mode and LTP mode. More specifically, it may change the operation mode according to the periodicity of a given source speech signal. Alternatively, the speech coding processor 1a may be configured to code the speech signal in both CELP and LTP modes, compare the two outcomes, and choose one of them that provides higher speech quality.

As FIG. 6 shows, the mode selection means 31 enables its terminal connection "c-a" when the speech coding processor 1a operates in CELP mode. When switching the mode to LTP mode, the mode selection means 31 changes the connection from "c-a" to "c-b." While the above-described first embodiment has only two modes to simplify the explanation, it may provide three or more operation modes including LTP mode. The details of mode switching in accordance with the periodicity of a given source speech signal will be discussed later. The state updating means 33 shown in FIG. 8 will also be described later.

As seen from the above, the first embodiment of the present invention provides two operation modes, CELP and LTP modes, so that the source speech signal will be coded adaptively by switching between the two modes.

According to the present invention, the LTP mode allocates some portion of quantized data bits to the LTP synthesis filter 12, instead of consuming that portion for a noise codebook Bn which makes little contribution to the representation of periodicity of a speech signal. This arrangement enhances the speech coding in handling the periodicity of a source speech signal.

According to the present invention, the LTP mode operation provides sufficient performance in coding such speech signals that the conventional coders are unable to handle properly. Also, the proposed speech coding processor switches the operation mode to CELP mode when the speech signal contains at most one periodic component per frame, thus making the speech coding process more flexible and efficient.

The next section will now focus on how the lag parameter L is varied in the speech coding process. As already explained in an earlier part of the description, the speech coding processor varies the parameter L in an attempt to obtain prediction errors corresponding to various lag values, and then it finds a minimum error point that yields the smallest error value. To simplify the explanation, it is supposed that the speech coding processor extracts a single signal vector from the adaptive codebook Ba.

Figure 7:
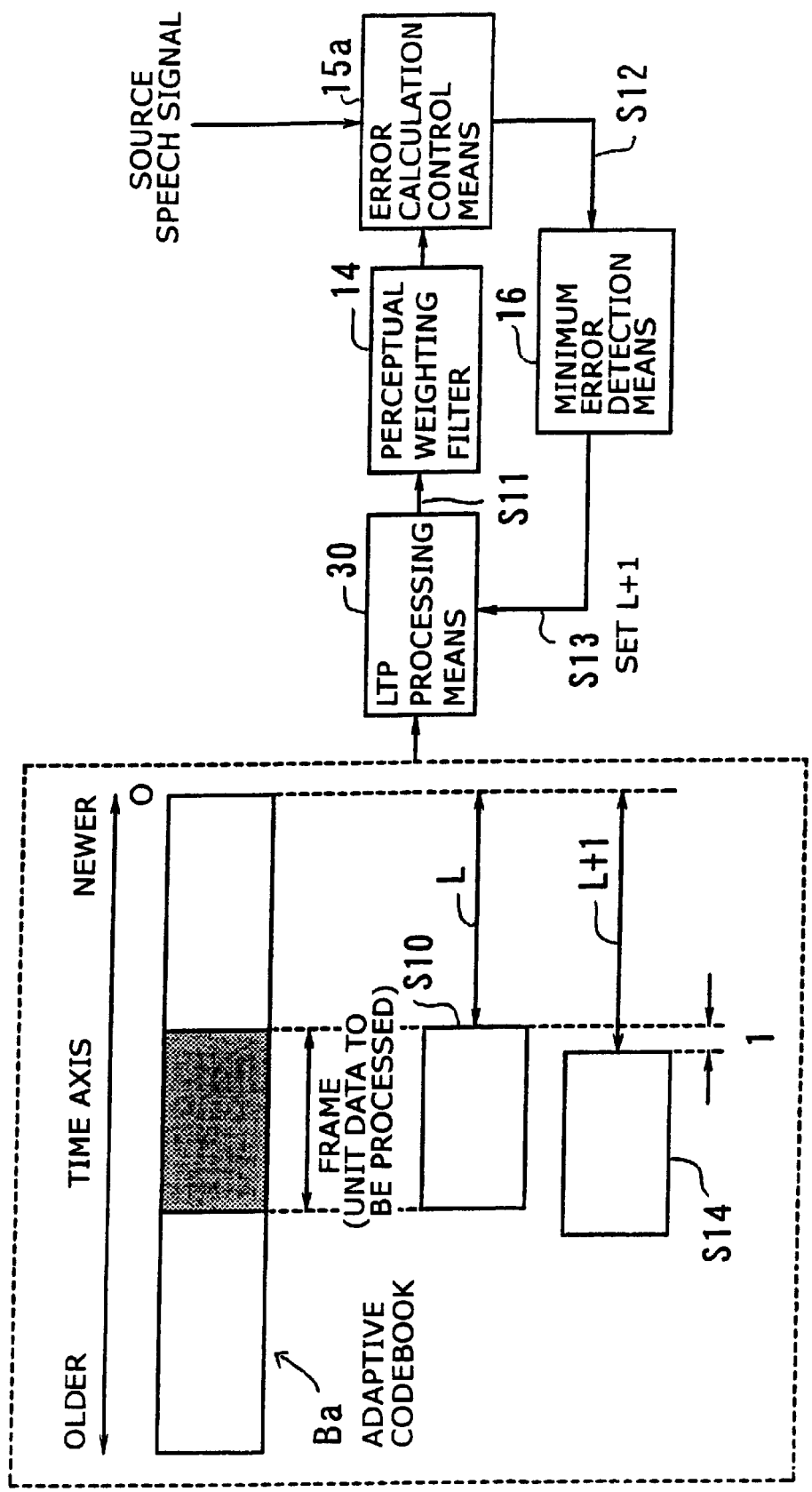
FIG. 7 is a diagram which shows how the lag parameter is changed.

FIG. 7 is a diagram which shows how the lag parameter L is varied. It is assumed that the entries of the adaptive codebook Ba are chronologically ordered along the time axis shown in FIG. 7, newer signal vectors being placed in the right-hand direction and older signal vectors in the left-hand direction.

(S10) A frame-long signal (signal vector) is extracted from the location at the distance L relative to the top entry location O of the adaptive codebook Ba.

(S11) The signal vector extracted at step S10 is supplied to the perceptual weighting synthesis filter 14 after being LTP-processed by the LTP processing means 30.

(S12) The error calculation control means 15a calculates the error of the output of the perceptual weighting synthesis filter 14 with respect to the original source speech signal.

(S13) The minimum error detection means 16 then commands the vector extraction means 11 employed in the LTP processing means 30 to set a value (L+1) to the parameter L.

(S14) The vector extraction means 11 extracts another frame-long signal at the distance equal to the updated L (=L+1) from the top location O of the adaptive codebook Ba.

The above steps S11 to S14 are executed repeatedly for all possible lag values L in order to locate a minimum error point. While not explicitly stated above, the noise codebook Bn is also scanned by incrementing the lag parameter from L to L+1.

Figure 8:
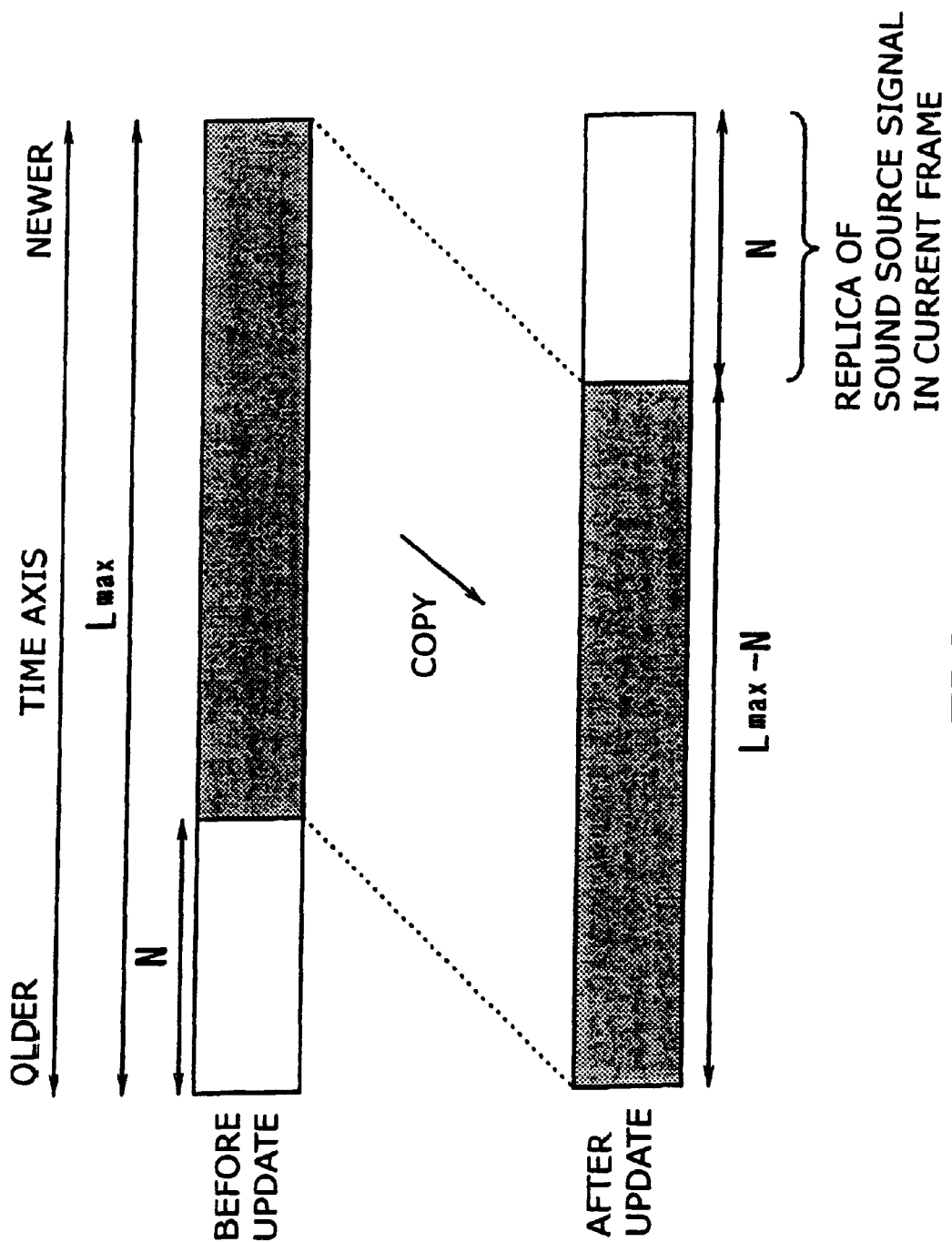
FIG. 8 is a diagram which shows a state update of the adaptive codebook.

The next section will now explain more about the state updating means 33. FIG. 8 is a diagram which shows a state update of the adaptive codebook Ba.

The adaptive codebook Ba stores $L_{max}$ pieces of the past sound source signal information, or signal vectors. In FIG. 8, the variable N indicates the length of a frame, i.e., a single unit of data to be coded. The state updating means 33 discards the oldest N samples in the adaptive codebook Ba and shifts the remaining signals to the left-hand end (i.e., toward the past), resulting in a vacant area at the right-hand end. It then copies the sound source signal selected for the current frame (i.e., the linear combination of the outputs of the adaptive codebook Ba and noise codebook Bn) to the now-vacant area of the adaptive codebook Ba. Therefore, the adaptive codebook Ba always maintains the latest sound source signals at its right-hand end (i.e., the newest end). The state updating means 33 executes such a state updating process each time the coding of a frame or the quantization of optimal values is finished.

Figure 9:
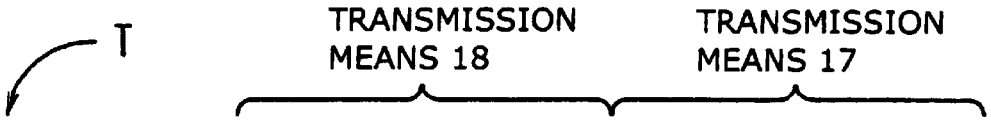
FIG. 9 is a diagram which shows data transmitted by a speech coding processor.

The next section will now focus on the optimal value transmission means 17 and coded data transmission means 18. FIG. 9 is a diagram which shows data transmitted by the speech coding processor 1a.

Table T contains the following items: "Mode Parameter," "Lag," "Noise Codebook Index," "Gain Index," "LPC Filter Coefficient Index," and "LTP Filter Coefficient Index." "Mode Parameter" (MODE) indicates whether the speech coding processor is operating in CELP mode or LTP mode. "Lag" (L) shows the displacement measured from the top entry location of the adaptive codebook Ba. "Noise Codebook Index" (Index c1) is the index that is obtained when quantizing a code vector extracted from the noise codebook Bn. "Gain Index" (Index Gain) is the index that is obtained by quantizing the optimal gain. "LPC Filter Coefficient Index" (Index Lpc) is the index that is obtained by quantizing the LPC filter coefficients. "LTP Filter Coefficient Index" (Index Ltp) is the index that is obtained by quantizing the LTP filter coefficients. The data of the table T is transmitted by the coded data transmission means 18 in CELP mode, or by the optimal value transmission means 17 in LTP mode.

Figure 10:
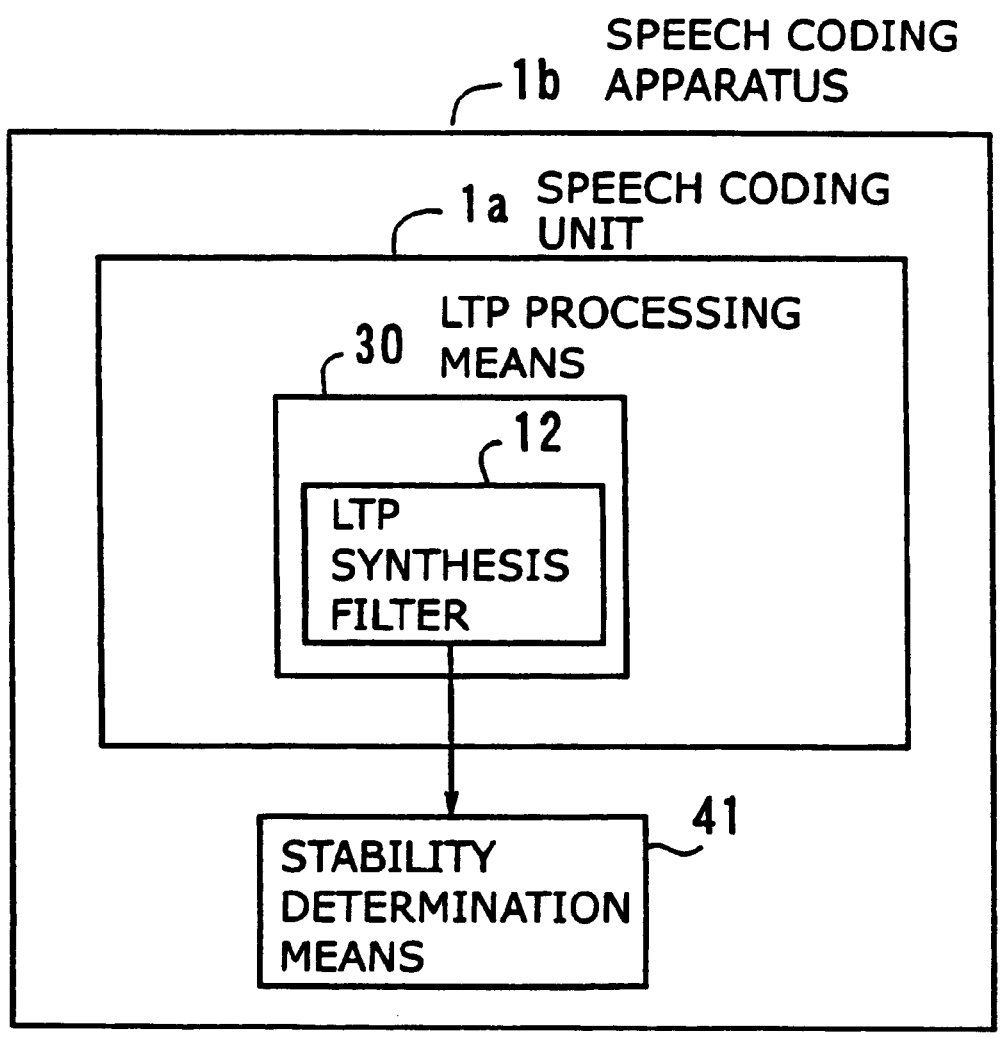
FIG. 10 is a diagram which shows the structure of a second embodiment of the present invention.

The next section will explain a second embodiment of the proposed speech coding processor 1. FIG. 10 shows the structure of the second embodiment of the present invention in simplified form. In this diagram, what has been described as the speech coding processor 1a in the first embodiment is renamed to the speech coding unit 1a.

According to the second embodiment, the proposed speech coding processor 1b has a stability determination means 41 in addition to the speech coding unit 1a. This stability determination means 41 determines whether the LTP synthesis filter 12 is stable, during the process of searching for optimal LTP filter coefficients βa and optimal lag La in LTP mode. If the LTP synthesis filter 12 is determined to be unstable with a particular combination of LTP filter coefficients and lag parameter L, the stability determination means 41 excludes that combination from the list of candidates for the optimal value selection.

The LTP synthesis filter 12 is characterized by the filter coefficients obtained from equation (8). It should be noted here that the stability of this LTP synthesis filter 12 is not necessarily guaranteed, because the matrix R contained in equation (8) is a covariance matrix. Our experiments have revealed that the calculated LTP filter coefficients tend more often to be unstable as their order increases.

When the LTP synthesis filter 12 is stable, the absolute values of k parameters (PARCOR coefficients) obtained from its coefficients are proved not to exceed one. On the other hand, when the filter is not guaranteed to be stable, the range of its k parameters is wider than that of stable filters, resulting in increased inefficiency in the quantization.

As seen from the above discussion, an attempt to improve the reproduced speech quality by increasing the order of the LTP synthesis filter 12 could lead to a higher chance of yielding unstable filter coefficients, as well as aggravating the quantization efficiency. To solve those problems, according to the second embodiment of the present invention, the speech coding processor 1b is designed to determine the stability of the LTP synthesis filter 12 (which is characterized by LTP filter coefficients obtained) in the course of searching for the optimal LTP filter coefficients βa and optimal lag La. If the filter 12 turns out to be unstable with a certain set of LTP filter coefficients and lag parameter, the speech coding processor 1b will disregard such inappropriate coefficients and lag parameter when choosing optimal ones.

While there may be many appropriate method to test the stability, one possible method is to evaluate the absolute values of k parameters converted from LTP filter coefficients. Another method is based on the pole arrangement that is directly obtained from LTP filter coefficients. The next section will describe the latter method.

The method solves the following pth-order algebraic equation (11) to yield the roots z (i=1 through p).

$$1 = \beta_1 z^{-1} + \beta_2 z^{-2} + \ldots + \beta_p z^{-p} = 0 \quad (11)$$

where $\beta i$ represents LTP filter coefficients, and p is the order of LTP. Since the coefficients $\beta_i$ are real, the roots $z_i$ of equation (11) are real roots (equal roots) or complex conjugate roots. That is, they can be expressed as $z_i=\text{Re}\{z_i\}+j\text{Im}\{z_i\}$, where $\text{Re}\{z_i\}$ and $\text{Im}\{z_i\}$ represent the real part and imaginary part of $z_i$, respectively. A pole arrangement diagram is obtained by plotting each combination of $\text{Re}\{z_i\}$ and $\text{Im}\{z_i\}$ on the z-plane.

Figure 11:
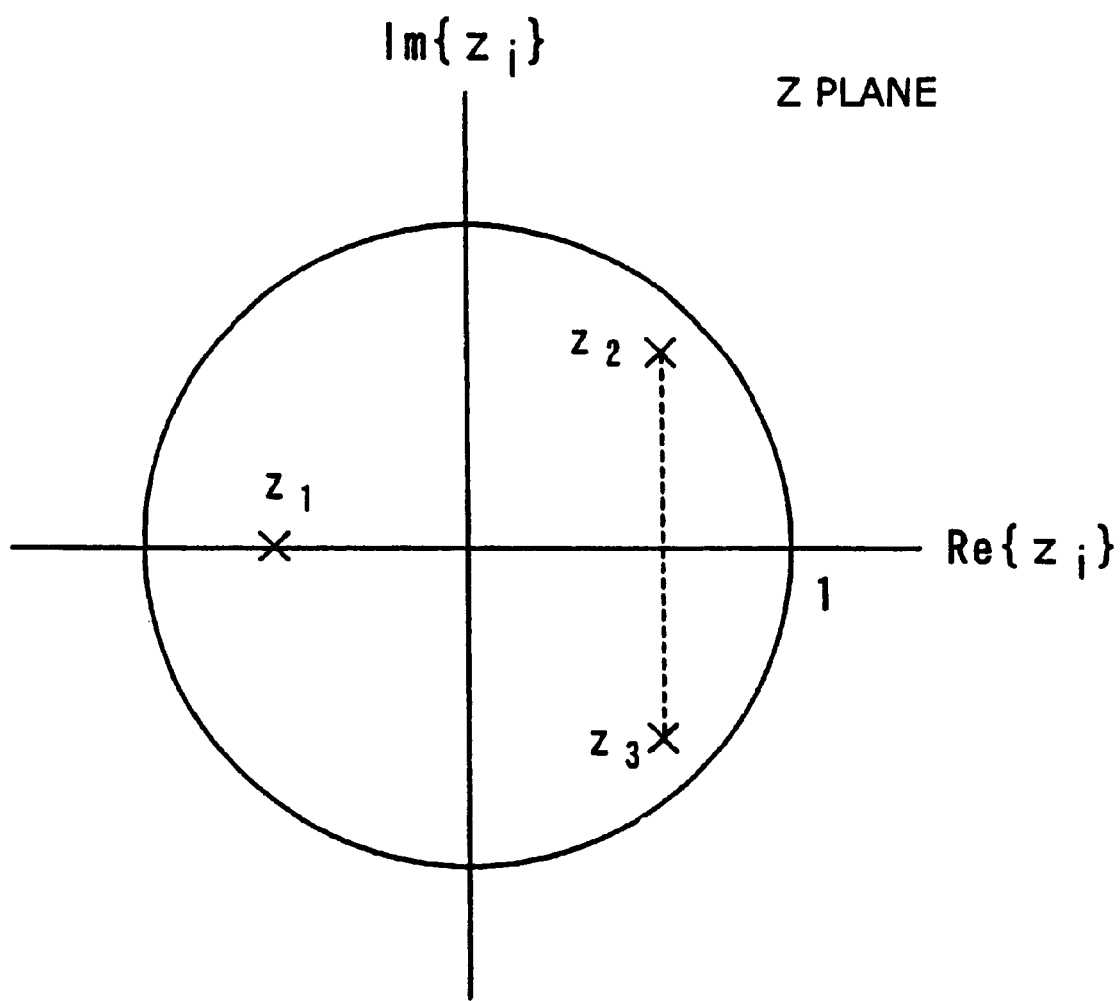
FIG. 11 is a diagram which shows an example of pole arrangement of a stable filter.
Figure 12:
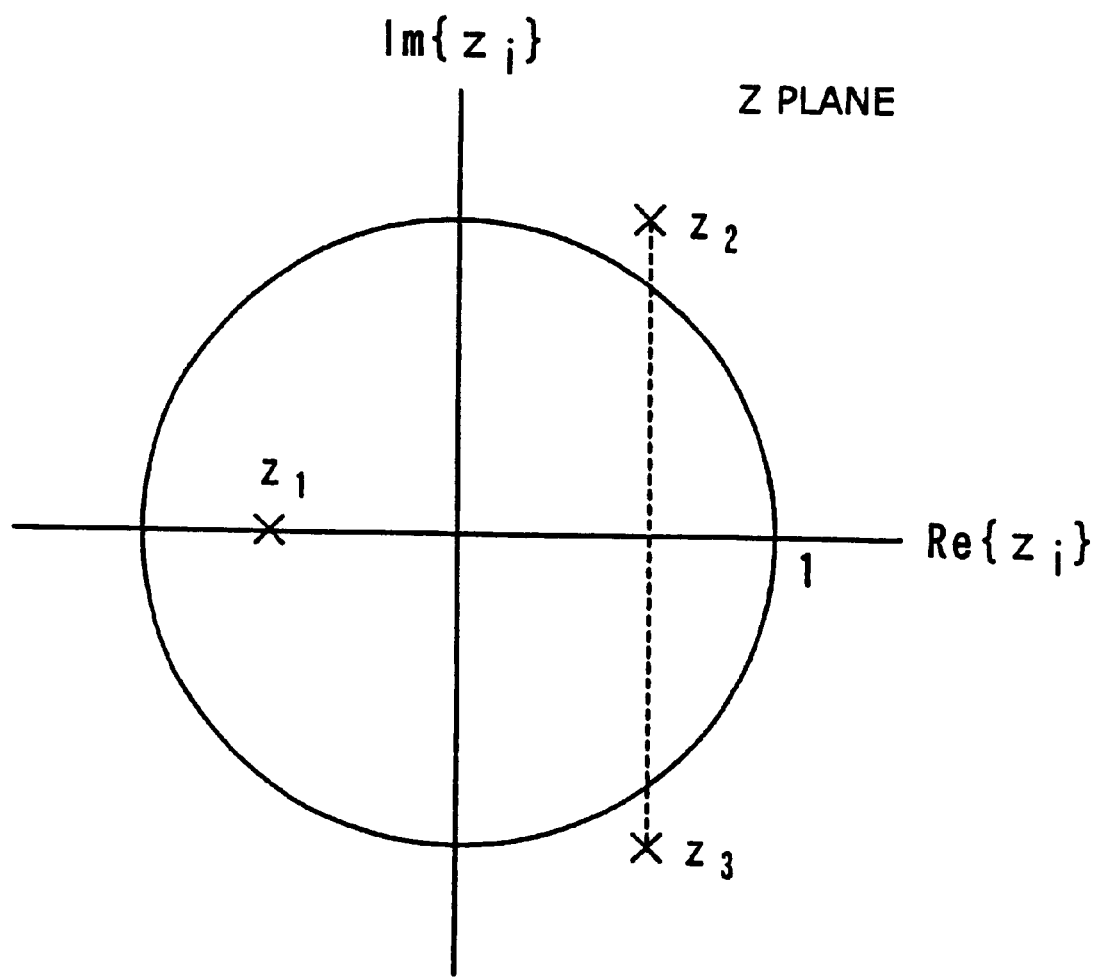
FIG. 12 is a diagram which shows an example of pole arrangement of an unstable filter.

FIG. 11 shows an example of a pole arrangement diagram of a stable filter, while FIG. 12 shows the same of an unstable filter. In both diagrams, the vertical axis represents $\text{Im}\{z_i\}$, and the horizontal axis represents $\text{Re}\{z_i\}$. In the first example of FIG. 11, all poles $z_i$ reside within the unit circle on the z-plane, meaning that the filter is stable. In the second example of FIG. 12, however, two poles $z_2$ and $z_3$ reside outside the unit circle, although one pole $z_1$ is within the unit circle, indicating that the filter is unstable. In this way, the stability determination means 41 enables the speech coding processor 1b to determine the filter stability and remove inappropriate LTP filter coefficients and lag parameter out of the list of candidates for selection. With this feature, the proposed speech coding processor 1b can extract stable parameters selectively.

While the above explanation has assumed that the stability test is performed in the course of searching for an optimal solution in LTP mode, it is not intended to limit the invention to this specific arrangement. As an alternative implementation, the speech coding processor 1b may be configured to evaluate the filter stability with the determined optimal LTP filter coefficients βa, not during the search, but after the search is finished. In the case where the resulting LTP synthesis filter 12 is expected to be unstable, the speech coding processor 1b will enter to CELP mode, instead of choosing LTP mode.

Figure 13:
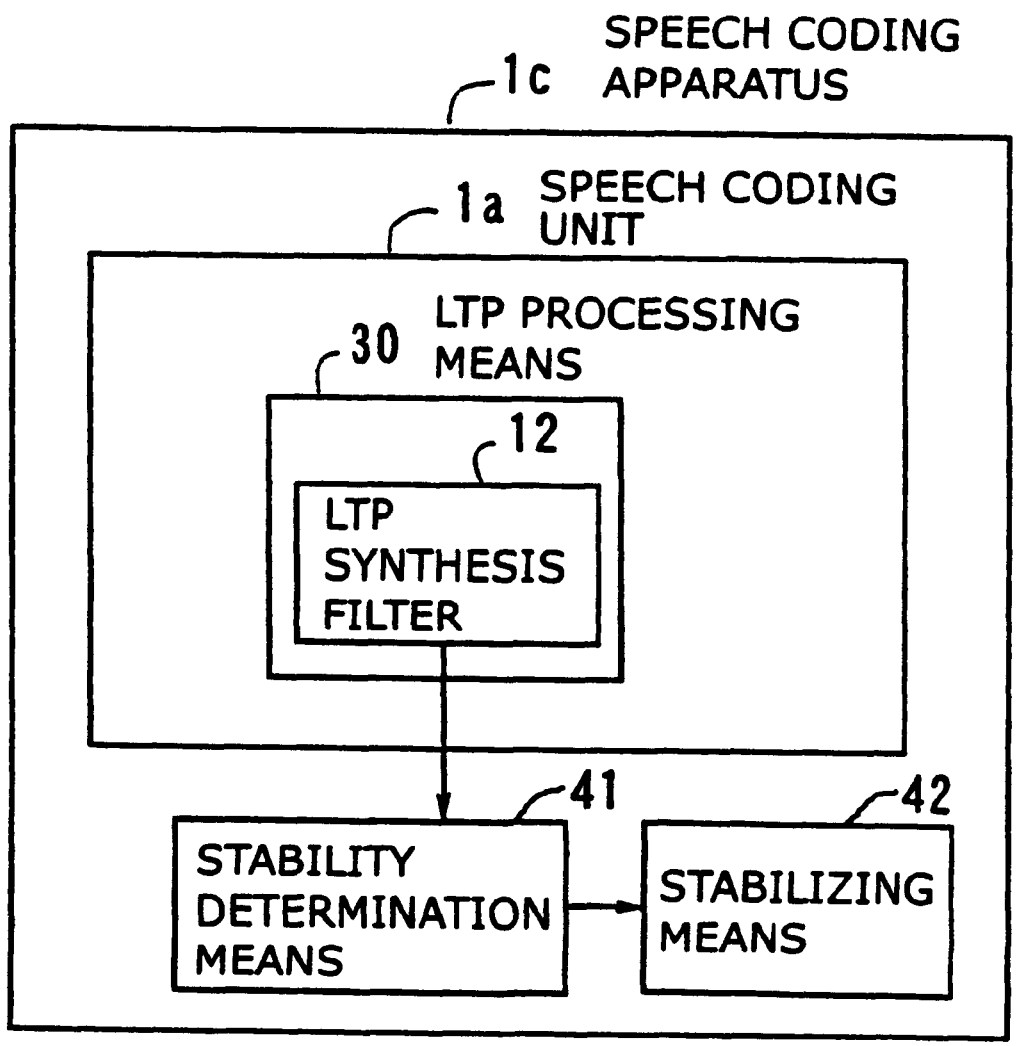
FIG. 13 is a diagram which shows the structure of a third embodiment of the present invention.

The next section will describe a third embodiment of the proposed speech coding processor 1. FIG. 13 is a diagram which shows the structure of the third embodiment of the present invention. Compared to the speech coding processor 1a described earlier, this speech coding processor 1c further comprises a stability determination means 41 and a stabilization processing means 42. When the stability determination means 41 has identified the LTP synthesis filter 12 as being unstable, the stabilization processing means 42 stabilizes the LTP filter coefficients and lag parameter L in question.

Recall that the foregoing second embodiment determines the filter stability and weed out inappropriate combinations of LTP filter coefficients and lag parameter from the list of candidates for selection, thereby ensuring the stability of selected filter coefficients. In fact, however, unstable LTP filter coefficients are more likely to be produced as their order increases. Since such coefficients should be discarded, the speech coding processor 1b would encounter a shortage of usable candidates of lag and LTP filter coefficients, thus making it difficult to provide sufficient coding performance.

To solve the above problem, the third embodiment of the invention is arranged as follows. That is, it first calculates LTP filter coefficients for each lag value in a searching process. It then determines the filter stability as in the second embodiment, and if the LTP synthesis filter 12 is found unstable, it modifies the LTP filter coefficients to stabilize the filter 12. When the LTP synthesis filter 12 is found stable, no modification is made to the LTP filter coefficients.

While there may be other methods, one practical method to stabilize the LTP synthesis filter 12 is to calculate pole locations on the z-plane from given filter coefficients and then move the poles to the inside of the unit circle. This method, referred to herein as the "pole rearrangement method," will now be described in more detail below.

The pole rearrangement method starts with solving equation (11) to yield the roots $z_i$, as in the second embodiment.

In equation (11), $\beta_i$ are LTP filter coefficients, and the roots $z_i$ are expressed as $z_i=\text{Re}\{z_i\}+j\text{Im}\{z_i\}$. As already stated, $\text{Re}\{z_i\}$ and $\text{Im}\{z_i\}$ represent the real part and imaginary part of $z_i$, respectively. Pole arrangement is obtained by plotting each combination of $\text{Re}\{z_i\}$ and $\text{Im}\{z_i\}$ on the z-plane. The stability determination means 41 calculates such roots zi and regards the filter as being stable when all poles are contained in the unit circle. If any pole resides outside the unit circle, it determines that the filter in question is unstable.

The result (i.e., stable/unstable) of the above test is supplied to the stabilization processing means 42, together with the LTP filter coefficients of interest. For a stable LTP synthesis filter 12, its coefficients $\beta_i$ are treated as optimal ones $\beta_i a$, without the need for modifying their values. When the given filter is unstable, it is treated according to the following equation (12).

$$z_i a = \frac{z_i^*}{|z_i|^2} \quad (i=1,\cdots,p) \tag{12}$$

where $z_i$ represents the roots of equation (11) before stabilization; $z_i a$ represents stabilized roots, and $z^*_i$ denotes the complex conjugate root of $z_i$. Equation (12) gives a transform to the LTP synthesis filter 12 which stabilizes its behavior while preserving it inherent frequency response.

The roots $z_i a$ stabilized with equation (12) are converted to stable LTP filter coefficients $\beta_i a$ by using the relationship of equation (13).

$$1 - \sum_{i=1}^{p} \beta_i a \cdot z^{-i} = \prod_{i=1}^{p} (1 - z_i a \cdot z^{-1}) \tag{13}$$

The resultant LTP filter coefficients $\beta_i a$ are subjected to error evaluation during the searching process in LTP mode. By stabilizing an unstable LTP synthesis filter 12 in this way, the third embodiment prevents the coded speech signal from quality degradation. Also, it is not necessary to immediately discard calculated LTP filter coefficients and lag parameters, even when their values indicate instability of the LTP synthesis filter 12. While a high-order LTP filter tends to be unstable, the stabilization mechanism prevents the coded speech signal from quality degradation.

Figure 14:
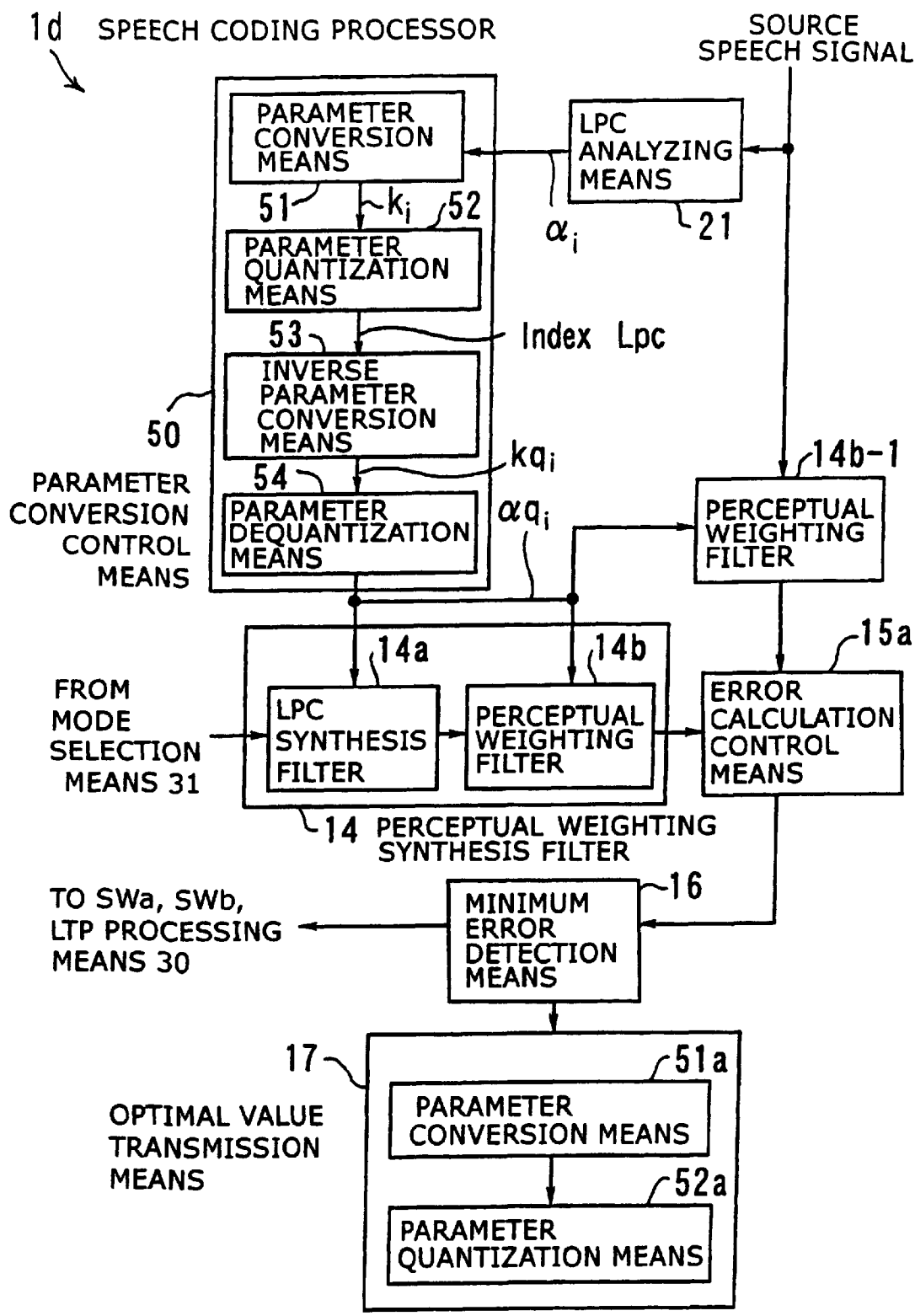
FIG. 14 is a diagram which shows the structure of a fourth embodiment of the present invention.

The next section will describe a fourth embodiment of the present invention. FIG. 14 is a diagram which shows the structure of a speech coding processor 1d according to the fourth embodiment. This speech coding processor id differs from the speech coding processor 1a in that it further employs a parameter conversion control means 50.

The parameter conversion control means 50 comprises a parameter conversion means 51, a parameter quantization means 52, a parameter inverse conversion means 53, and a parameter dequantization means 54. The parameter conversion means 51 converts the output $\alpha_i$ of the LPC analyzing means 21 into parameters $k_i$. The parameter quantization means 52 quantizes those parameters $k_i$ to produce Index Lpc. The parameter inverse conversion means 53 dequantizes, thus producing $kq_i$. $kq_i$ is converted back to by the parameter dequantization means 54.

The optimal value transmission means 17 includes a parameter conversion means 51a and a parameter quantization means 52a. FIG. 14 only shows the parameter conversion control means 50 and its surroundings. Explanation for other structural elements is omitted because they are common to the speech coding processor la described earlier.

The LTP synthesis filter 12 exhibits a high coefficient sensitivity since it is configured as an all-pole resonance circuit having a feedback path from output to input. When the quantized LTP filter coefficients with a large quantization error were delivered to the decoding end, the LTP synthesis filter 12 in the decoder could oscillate or produce an increased spectrum distortion because of its high coefficient sensitivity, thus causing serious quality degradation in the reproduced speech.

To solve the above problem, the fourth embodiment of the present invention is configured to quantize the LTP filter coefficients after converting them into different (but functionally equivalent) parameters. Such parameters may be k parameters (or PARCOR coefficients) or line spectrum pairs (LSP), for example. Originally, k parameters have been known as parameters equivalent to LPC filter coefficients that are obtained by analyzing a given signal with LPC techniques. Those skilled in the art know the formulas for conversion from LPC filter coefficients to k parameters, or vise versa. LSP also serves as the parameters equivalent to LPC filter coefficients. Those skilled in the art know the formulas for conversion from LPC filter coefficients to LSP parameters, or vise versa.

Those k parameters and LSP parameters are superior to LPC filter coefficients in terms of quantization performance. For this reason, CELP coders convert LPC filter coefficients into k parameters before quantizing them. The fourth embodiment applies the above-described relationship between LPC filter coefficients and k parameters (or LSP parameters) to the handling of LTP filter coefficients.

The following section will explain a method of converting from LTP filter coefficients to k parameters, which is referred to as the "step-down procedure." The explanation, however, will also be applicable to LSP.

The conversion from LTP filter coefficients to k parameters (also called the step-down procedure) is given by the following equations (14) and (15).

$$k_i = \alpha_i^{(i)} \tag{14}$$

$$\alpha_j^{(i-1)} = \frac{\alpha_j^{(i)} + \alpha_i^{(i)} \cdot \alpha_{i-j}^{(i)}}{1 - k_i^2} (1 \leq j \leq i-1) \tag{15}$$

where i is decremented from p to 1. Initially, equation (16) applies.

$$\alpha_j^{(p)} = \alpha_j \, (1 \leq j \leq p) \tag{16}$$

where $\alpha_j$ represents LTP filter coefficients, and p is the order of the filter. This conversion yields a series of k parameters $k_i$. Equations (17) and (18), on the other hand, show a step-up procedure which converts k parameters back to LTP filter coefficients.

$$\alpha_i^{(i)} = k_i \tag{17}$$

$$\alpha_j^{(i)} = \alpha_j^{(i-1)} - k_i \alpha_{i-j}^{(i-1)} \, (i \leq j \leq i-1) \tag{18}$$

LTP filter coefficients $\alpha_j$ are obtained by solving the above equations for i=1 to p and then assigning the resultant set of coefficients to LTP filter coefficients $\alpha_j$ as shown in equation (19).

$$\alpha_j = \alpha_j^{(p)} (i \leq j \leq i-1) \tag{19}$$

As described above, the fourth embodiment of the invention realizes high-quality speech coding in LTP mode, within a limited rate of quantized bit streams. This is accomplished by quantizing LTP filter coefficients, not directly, but after converting them into other equivalent forms such as k parameters or LSP.

The next section will describe how the mode selection means 31 switches the operation mode in accordance with the periodicity of a source speech signal.

The function of the mode selection means 31 is to identify the properties of a given speech signal and choose an appropriate operation mode (CELP mode or LTP mode) depending on the identified properties. More specifically, it uses the pitch prediction gain obtained from each input frame, which represents the periodicity of a given speech signal in terms of pitch intervals. The following paragraph will be devoted to the explanation of this method.

The process begins with the computation of autocorrelation $R_{cc}(L)$ and cross-correlation $R_{cx}(L)$ of a source speech signal x(n) (i=0 to N−1) according to the following equations (20) and (21).

$$R_{cc}(L) = \sum_{i=0}^{N-1} x(n-L) \cdot x(n-L) \tag{20}$$

$$R_{cx}(L) = \sum_{i=0}^{N-1} x(n) \cdot x(n-L) \tag{21}$$

where the parameter L represents a time lag with a range of $L_1 \leq L \leq L_2$. Such $R_{cc}(L)$ and $R_{cx}(L)$ are calculated, varying the lag parameter L from $L_1$ to $L_2$. The pitch prediction gain G(L) can then be obtained from the following equation (22).

$$G(L) = \frac{R_{cx}(L)}{R_{cc}(L)} \tag{22}$$

This pitch prediction gain G(L) is calculated for every possible L value within a range between $L_1$ and $L_2$, and the largest value of G(L) is then identified. This value is referred to as $G(L)_{max}$. Subsequently, $L(G)_{max}$ is compared with a predetermined threshold Th. When $L(G)_{max}$ is greater than the threshold Th, it is an indication of strong periodicity of the source speech signal, thus causing the mode selection means 31 to choose LTP mode. On the other hand, when $L(G)_{max}$ is smaller than Th, it implies weak periodicity. The mode selection means 31 then selects CELP mode.

While the above explanation has assumed the use of pitch prediction gain of a source speech signal as the key parameter for determining the operation mode, other characteristic parameters may also be used. The operation mode may also be determined based on a combination of a plurality of characteristic parameters.

As seen from the above discussion, the mode selection means 31 enables appropriate mode selection in such a way that the optimal coding mode will be selected in accordance with the characteristics of a source speech signal. This feature will contribute to improved quality of coded speech signals.

Figure 15:
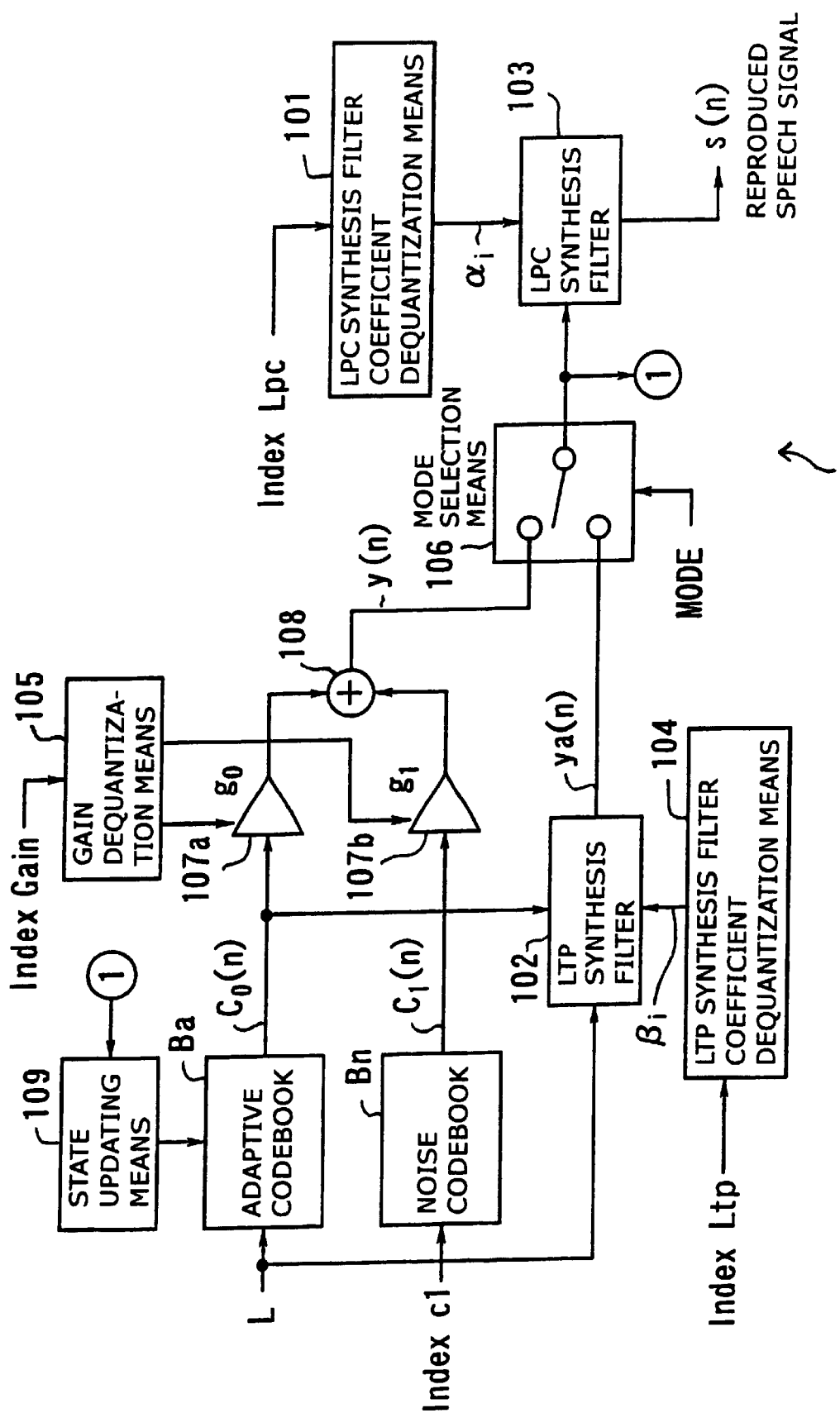
FIG. 15 is a diagram which shows the structure of a speech decoding processor.

The next section will now explain more about the speech decoding processor 2. FIG. 15 is a diagram which shows the structure of a speech decoding processor. This speech decoding processor 2a is a decoder for reproducing the original speech from the data that is provided by the speech coding processor 1 operating in CELP mode or LTP mode.

The speech decoding processor 2a receives data shown in FIG. 9, according to the current operation mode. The quantized index "Index Lpc" representing LPC filter coefficients is entered to an LPC coefficient dequantization means 101, which reproduces LPC filter coefficients $\alpha_i$ (i=1 to m). An LPC synthesis filter 103 is configured with the reproduced coefficients $\alpha_i$. The LPC synthesis filter 103 is used commonly in CELP and LTP modes.

The mode parameter "MODE" determines the state of a mode selection means 106. In CELP mode, the signal is decoded as follows. First, an entry $C_0(n)$ (n=0 to N−1) corresponding to a lag value L is extracted from an adaptive codebook Ba, where N is the frame length. Similarly, a signal $C_1(n)$ (n=0 to N−1) corresponding to a given noise codebook index "Index c1" is extracted from a noise codebook Bn. Further, a given gain index "Index Gain" is supplied to a gain dequantization means 105, which outputs gain parameters $g_0$ and $g_1$ for use with the adaptive codebook and noise codebook, respectively. These gain parameters $g_0$ and $g_1$ are then supplied to multipliers 107a and 107b, respectively. The multiplier 107a multiplies the code vector $C_0(n)$ extracted from the adaptive codebook Ba by the gain $g_0$, thereby producing $g_0 \cdot C_0(n)$. Likewise, the multiplier 107b multiplies the code vector $C_1(n)$ extracted from the noise codebook Bn by the gain $g_1$, thereby producing $g_1 \cdot C_1(n)$.

The multiplier outputs $g_0 \cdot C_0(n)$ and $g_1 \cdot C_1(n)$ are then subjected to an adder 108 to yield a sound source signal y(n) (n=0 to N−1), which is expressed as the following equation (23).

$$y(n)=g_0 \cdot C_0(n)+g_1 \cdot C_1(n)(n=0,\ldots,N-1) \quad (23)$$

By feeding this signal y(n) to the LPC synthesis filter 103, a reproduced speech signal s(n) (n=0 to N−1) is obtained. Further, the sound source signal y(n) derived from the current frame is fed back to the adaptive codebook Ba to update its content. While there may be other applicable methods, the feedback is accomplished with the following equations (24) and (25).

$$acb(n)=acb(n+N)(0 \leq n \leq L_{max}-N-1) \quad (24)$$

$$acb(L_{max}-N+n)=y(n)(0 \leq n \leq N-1) \quad (25)$$

where acb(n) represents a specific entry location within the adaptive codebook (n=0 to $L_{max}-1$), and $L_{max}$ represents the size of the adaptive codebook (or the maximum value of the lag parameter).

On the other hand, when the mode parameter indicates "LTP mode," the signal is decoded as follows. First, the quantized index "Index Lpc" is supplied to the LTP filter coefficient dequantization means 104 to yield LTP synthesis filter coefficients $\beta_i$. Similarly to the CELP mode operation, an adaptive code vector $C_0(n)$ (n=0 to N−1) corresponding to a lag value L is then extracted from an adaptive codebook Ba and supplied to the LTP synthesis filter 102. The resulting sound source signal ya(n) is then supplied to the LPC synthesis filter 103 to obtain a reproduced speech signal s(n) (n=0 to N−1). Further, the sound source signal ya(n) derived from the current frame is fed back to the adaptive codebook Ba to update its content. To accomplish this feedback, the same method can be used as in the case of CELP mode, although there may be other applicable methods.

As seen from the above explanation, the proposed speech decoding processor 2a can reproduce (decode) a high-quality speech signal from the coded data that has been produced by the speech coding processor 1.

Figure 16:
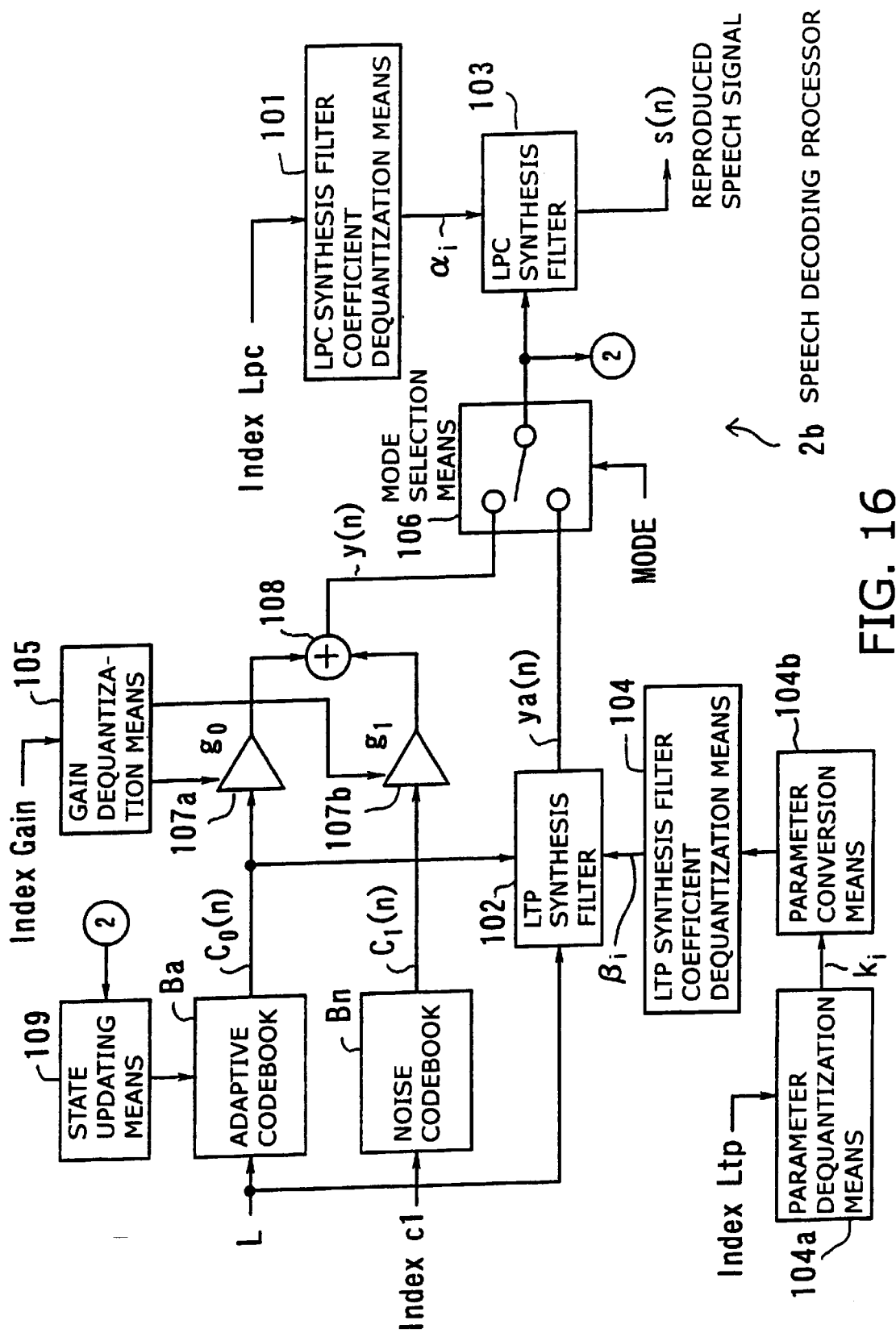
FIG. 16 is a diagram which shows the structure of another speech decoding processor.

The following will explain a speech decoding processor which is designed to decode the data produced by the speech coding processor 1d of FIG. 14; FIG. 16 shows its structure. This speech decoding processor 2b reproduces the original speech from data coded by the speech coding processor 1d described earlier as the fourth embodiment of the present invention. Recall that speech coding processor 1d has two distinctive operation modes (CELP mode and LTP mode) as well as such a mechanism that quantizes LTP synthesis filter coefficients after converting them into equivalent parameters such as k parameters or LSP. While it uses a different method to produce LTP filter coefficients, the speech decoding processor 2b is similar to the foregoing speech decoding processor 2a. Because of this similarity, the following explanation will focus on its LTP mode operation.

When the mode parameter indicates "LTP mode," the received speech signal is decoded as follows. First, the quantized index "Index Lpc" is supplied to the parameter dequantization means 104a to yield k parameters $k_i$ (i=1 to p), where p represents the order of the LTP synthesis filter 102. The produced parameters $k_i$ are then entered to a parameter conversion means 104b to obtain LTP synthesis filter coefficients $\beta_i$ (i=1 to p). The parameter conversion means 104b performs the step-up procedure of equation (17) described earlier in the fourth embodiment of the present invention.

The LTP synthesis filter 102 is designed to operate with a given lag value L and coefficients $\beta_i$. A codebook entry $C_0(n)$ corresponding to the lag L is extracted from the adaptive codebook Ba and supplied to the LTP synthesis filter 102. The resulting sound source signal ya(n) is then supplied to the LPC synthesis filter 103 to obtain a reproduced speech signal s(n) (n=0 to N−1). Further, the sound source signal ya(n) derived from the current frame is fed back to the adaptive codebook Ba to update its content. While there may be other applicable methods, the foregoing equations (24) and (25) are used to provide a feedback.

As described above, the speech decoding processor 2b can reproduce (decode) a high-quality speech signal from the coded data that has been produced by the speech coding processor 1d.

Figure 17:
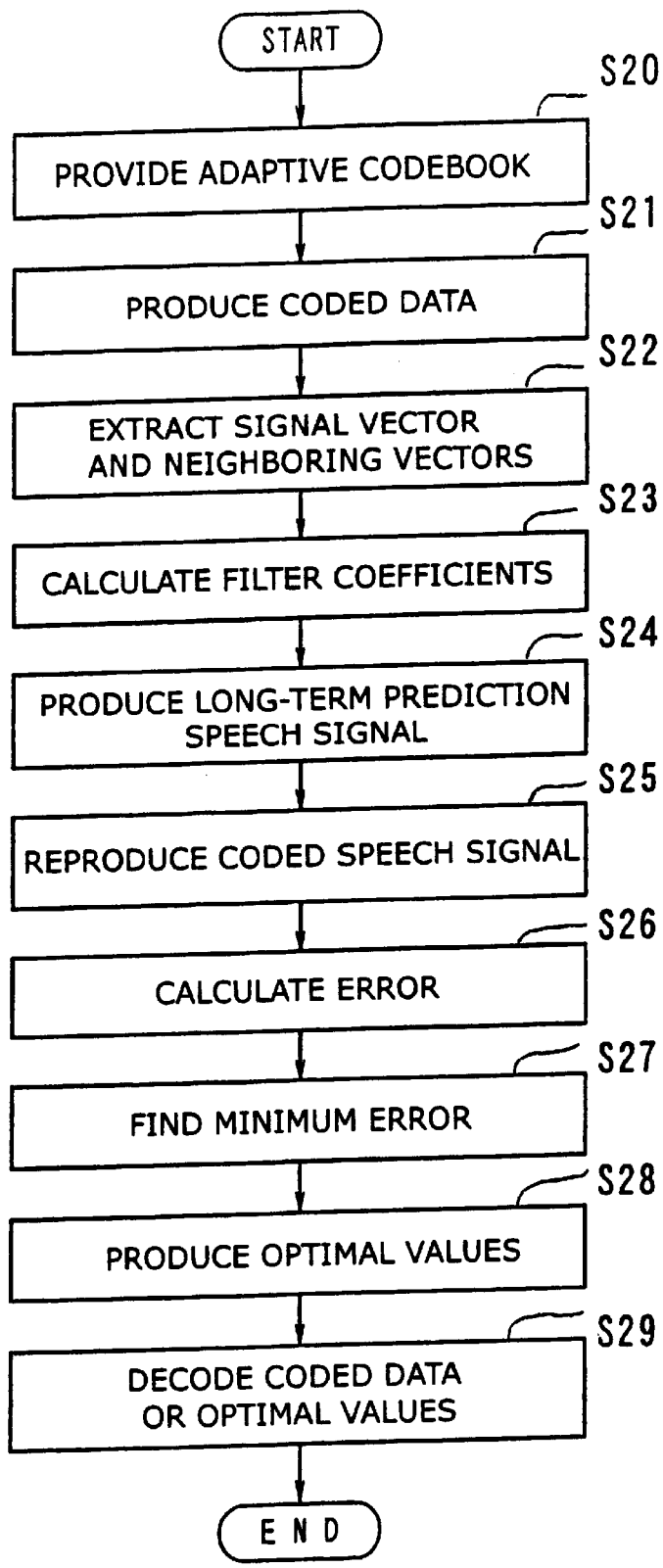
FIG. 17 is a flowchart of a speech processing method according to the present invention.

The next section explains a speech processing method according to the present invention. FIG. 17 is a flowchart of a speech processing method.

(S20) An adaptive codebook is provided to store a series of signal vectors of a past speech signal.

(S21) The speech signal is divided into fixed-length segments for processing purposes. When a segment contains one periodic component at most, coded data is produced by coding that frame.

(S22) When a fixed-length segment contains two or more periodic components, a signal vector is extracted from the adaptive codebook, together with its neighboring vectors. This signal vector is located at a distance given by a delay parameter from the top entry location of the adaptive codebook.

(S23) The coefficients of a long-term predictive synthesis filter 12 are calculated.

(S24) To analyze the periodicity in the speech signal, a long-term predictive analysis and synthesis are performed with the extracted signal vector and neighboring vectors by using a high-order LTP synthesis filter. This step yields a long-term predicted speech signal.

(S25) A reproduced coded speech signal is produced from the long-term predicted speech signal by using a linear predictive synthesis filter and a perceptual weighting filter. The linear predictive synthesis filter is defined through estimation with a linear predictive coding synthesis technique that emulates the vocal tract response. The perceptual weighting filter assigns perceptual weights to a given signal according to the characteristics of the human hearing system.

(S26) The error of the reproduced coded speech signal is calculated with reference to the speech signal.

(S27) The above steps are repeated while varying the lag parameter, thereby obtaining various error values corresponding to different lag values. Then a minimum error point yielding the smallest error value is identified.

(S28) Optimal values, including optimal filter coefficients and optimal lag, are transmitted. The terms "optimal filter coefficients" and "optimal lag" refer to the filter coefficients and the lag parameter at the identified minimum error point.

(S29) The original speech signal is reproduced by decoding the coded data or the optimal values.

As seen from the above discussion, according to the present invention, the speech processing apparatus 100 and speech coding method are configured to process a given speech signal with two algorithms. One algorithm encodes the speech signal to produce coded data when at most one periodic component is contained in a fixed-length segment of the speech signal. The other algorithm, which is activated when a plurality of periodic components are included in a fixed-length segment of the speech signal, executes speech coding with a high-order LTP synthesis filter that is obtained through estimation with a long-term predictive analysis and synthesis techniques, thereby yielding optimal values. At the decoding end, such resultant coded data and optimal values are decoded accordingly. This arrangement of the present invention enables a given speech signal to be coded in an optimal way, as well as to be reproduced at higher quality levels. While the use of CELP has been assumed so far, the first speech coding means 20 may employ any other type of speech coding algorithms.

To summarize the above description of the present invention, the proposed speech coding apparatus is configured to execute speech coding with a high-order LTP synthesis filter that is obtained through estimation with a long-term predictive analysis and synthesis techniques process a given speech signal, when a plurality of periodic components are included in a fixed-length segment of the speech signal. This feature enables a given speech signal to be coded in an optimal way, depending the characteristics of that signal.

In another aspect of the present invention, the proposed speech coding processor is configured to process a given speech signal with two mechanisms. One mechanism encodes the speech signal to produce coded data when at most one periodic component is contained in a fixed-length segment of the speech signal. The other mechanism, which is activated when a plurality of periodic components are included in a fixed-length segment of the speech signal, executes speech coding with a high-order LTP synthesis filter that is obtained through estimation with a long-term predictive analysis and synthesis techniques, thereby yielding optimal values. At the decoding end, such resultant coded data and optimal values are decoded accordingly. This arrangement enables a given speech signal to be coded in an optimal way, as well as to be reproduced at higher quality levels.

In yet another aspect of the present invention, the proposed speech processing method processes a given speech signal with two algorithms. One algorithm encodes the speech signal to produce coded data when at most one periodic component is contained in a fixed-length segment of the speech signal. The other algorithm, which is activated when a plurality of periodic components are included in a fixed-length segment of the speech signal, executes speech coding with a high-order LTP synthesis filter that is obtained through estimation with a long-term predictive analysis and synthesis techniques, thereby yielding optimal values. At the decoding end, such resultant coded data and optimal values are decoded accordingly. This arrangement enables a given speech signal to be coded in an optimal way, as well as to be reproduced at higher quality levels.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A speech coding apparatus which performs speech coding based on a speech production model, where a speech signal is divided into fixed-length segments for processing purposes, the apparatus comprising:

an adaptive codebook which stores a series of signal vectors of a past speech signal;

vector extraction means for extracting a signal vector and neighboring vectors adjacent thereto from said adaptive codebook, the signal vector being stored at a distance given by a lag parameter from the top entry location of said adaptive codebook;

a long-term prediction synthesis filter with a high order which produces a long-term predicted speech signal from the signal vector and the neighboring vectors by applying long-term prediction synthesis concerning the periodicity of the speech signal;

filter coefficient calculation means for calculating filter coefficients of said long-term prediction synthesis filter;

a perceptual weighting synthesis filter which processes the long-term predicted speech signal to yield a reproduced coded speech signal, comprising:

a linear predictive synthesis filter defined through estimation with a linear predictive coding synthesis technique that emulates a vocal tract response, and a first perceptual weighting filter which is coupled in series with said linear predictive synthesis filter and assigns perceptual weights to a signal supplied thereto according to characteristics of a human hearing system;

a second perceptual weighting filter which produces a perceptually weighted speech signal by assigning perceptual weights to the speech signal;

error calculation means for calculating an error of the reproduced coded speech signal with reference to the perceptually weighted speech signal;

minimum error detection means for finding a minimum error point that yields the smallest error among those that said error calculation means has calculated while varying the lag parameter; and optimal value transmission means for transmitting optimal values including optimal filter coefficients and an optimal delay, the optimal filter coefficients being the filter coefficients at the minimum error point, the optimal lag parameter being the lag parameter at the minimum error point.

2. The speech coding apparatus according to claim 1, further comprising stability determination means for determining the stability of said long-term prediction synthesis filter while said minimum error detection means searches for the optimal filter coefficients and optimal lag parameter, and excluding a particular combination of filter coefficients and lag parameter from a list of candidates for the optimal values if said long-term prediction synthesis filter is determined to be unstable with that combination.

3. The speech coding apparatus according to claim 2, further comprising stabilization processing means for stabilizing the particular combination of filter coefficients and lag parameter that has been determined by said stability determination means.

4. The speech coding apparatus according to claim 1, wherein said optimal value transmission means quantizes the optimal filter coefficients and transmits the quantized optimal filter coefficients.

5. The speech coding apparatus according to claim 1, wherein said optimal value transmission means converts the optimal filter coefficients into other parameters that are functionally equivalent thereto, quantizes the parameters, and transmits the quantized parameters.

6. The speech coding apparatus according to claim 1, wherein:

the neighboring vectors include two vectors located on opposite sides of the signal vector; and said long-term prediction synthesis filter is characterized by a transfer function P(z) of $$P(z)=1/(1-(\Sigma \beta_i z^{-(L-i)}),$$

where i is an integer ranging from $-J_1$ to $J_2$, $J_1$ is the location of one of the two vectors, J2 is the location of the other vector, z is a delay operator, $\beta_i$ represents the filter coefficients, and L represents the lag parameter.

7. The speech coding apparatus according to claim 1, wherein:

the neighboring vectors include a plurality ($J_3$) of vectors located on one side of the signal vector;

said long-term prediction synthesis filter is characterized by a transfer function Pa(z) of $$Pa(z)=1/(1-(\Sigma \beta_i z^{-i \cdot L})),$$

where i is an integer ranging from 1 to $J_3$, z is a delay operator, $\beta_i$ represents the filter coefficients, and L represents the lag parameter.

8. The speech coding apparatus according to claim 1, wherein:

the neighboring vectors include two vectors located on opposite sides of the signal vector;

said error calculation means calculates the error by using an error evaluation function of $$E^2=|X-\Sigma \beta_i \cdot H \cdot C_{L-i}|^2$$

where i is an integer ranging from $-J_1$ to $J_2$, $J_1$ is the location of one of the two vectors, J2 is the location of the other vector, E represents the error, X represents a reference signal vector, H represents an impulse response vector of said linear predictive synthesis filter, L represents the lag parameter, $\beta_i$ represents the filter coefficient and $C_L$ represents the signal vector.

9. A speech processing apparatus which performs speech analysis and synthesis based on a speech production model, comprising:

(a) a speech coding processor comprising:
 (a1) first speech coding means for producing coded data by coding a speech signal when at most one periodic component is contained in a fixed-length segment of the speech signal; and
 (a2) second speech coding means comprising:
  (a2a) an adaptive codebook which stores a series of signal vectors of a past speech signal for use in such cases where the fixed-length segment contains a plurality of periodic components;
  (a2b) vector extraction means for extracting a signal vector and neighboring vectors adjacent thereto from said adaptive codebook, the signal vector being stored at a distance given by a lag parameter from the top entry location of said adaptive codebook;
  (a2c) a long-term prediction synthesis filter with a high order which produces a long-term predicted speech signal from the signal vector and the neighboring vectors by applying long-term prediction synthesis concerning the periodicity of the speech signal;
  (a2d) filter coefficient calculation means for calculating filter coefficients of said long-term prediction synthesis filter;
  (a2e) a perceptual weighting synthesis filter which processes the long-term predicted speech signal to yield a reproduced coded speech signal, comprising:
   (a2e1) a linear predictive synthesis filter defined through estimation with a linear predictive coding synthesis technique that emulates a vocal tract response, and
   (a2e2) a first perceptual weighting filter which is coupled in series with said linear predictive synthesis filter and assigns perceptual weights to a signal supplied thereto according to characteristics of a human hearing system;
  (a2f) a second perceptual weighting filter which produces a perceptually weighted speech signal by assigning perceptual weights to the speech signal;
  (a2g) error calculation means for calculating an error of the reproduced coded speech signal with reference to the perceptually weighted speech signal;
  (a2h) minimum error detection means for finding a minimum error point that yields the smallest error among those that said error calculation means has calculated while varying the lag parameter; and
  (a2i) optimal value transmission means for transmitting optimal values including optimal filter coefficients and an optimal delay, the optimal filter coefficients being the filter coefficients at the minimum error point, the optimal lag parameter being the lag parameter at the minimum error point; and (b) a speech decoding processor comprising:
 (b1) first speech decoding means for reproducing the speech signal by decoding the coded data; and
 (b2) second speech decoding means for reproducing the speech signal by decoding the optimal values.

10. The speech processing apparatus according to claim 9, further comprising mode selection means for switching between said first speech coding means and second speech coding means according to the periodicity of the speech signal being supplied.

11. The speech processing apparatus according to claim 9, further comprising mode selection means for comparing a coded speech signal produced by said first speech coding means with the reproduced coded speech signal produced by said second speech coding means, and switching between said first speech coding means and second speech coding means, depending on which one of said first and second speech coding means provides better coding quality.

12. The speech processing apparatus according to claim 9, wherein said first speech coding means performs code-excited linear prediction to code the speech signal when a fixed-length segment thereof contains at most one periodic component.

13. The speech processing apparatus according to claim 9, wherein said speech decoding processor comprises said linear prediction synthesis filter and said long-term prediction synthesis filter.

14. The speech processing apparatus according to claim 9, wherein said optimal value transmission means quantizes the optimal filter coefficients and transmits the quantized optimal filter coefficients.

15. The speech processing apparatus according to claim 9, wherein said optimal value transmission means converts the optimal filter coefficients into other parameters that are functionally equivalent thereto, quantizes the parameters, and transmits the quantized parameters.

16. The speech processing apparatus according to claim 15, wherein said second speech decoding means in said speech decoding processor extracts the parameters from the optimal values, and converts the extracted parameters back to the optimal filter coefficients before decoding.

17. A speech coding processor which performs speech coding based on a speech production model, comprising:
   (a1) first speech coding means for producing coded data by coding a speech signal when at most one periodic component is contained in a fixed-length segment of the speech signal; and
   (a2) second speech coding means comprising:
      (a2a) an adaptive codebook which stores a series of signal vectors of a past speech signal for use in such cases where the fixed-length segment contains a plurality of periodic components;
      (a2b) vector extraction means for extracting a signal vector and neighboring vectors adjacent thereto from said adaptive codebook, the signal vector being stored at a distance given by a lag parameter from the top entry location of said adaptive codebook;
      (a2c) a long-term prediction synthesis filter with a high order which produces a long-term predicted speech signal from the signal vector and the neighboring vectors by applying long-term prediction synthesis concerning the periodicity of the speech signal;
      (a2d) filter coefficient calculation means for calculating filter coefficients of said long-term prediction synthesis filter;
      (a2e) a perceptual weighting synthesis filter which processes the long-term predicted speech signal to yield a reproduced coded speech signal, comprising:
         (a2e1) a linear predictive synthesis filter defined through estimation with a linear predictive coding synthesis technique that emulates a vocal tract response, and
         (a2e2) a first perceptual weighting filter which is coupled in series with said linear predictive synthesis filter and assigns perceptual weights to a signal supplied thereto according to characteristics of a human hearing system;
      (a2f) a second perceptual weighting filter which produces a perceptually weighted speech signal by assigning perceptual weights to the speech signal;
      (a2g) error calculation means for calculating an error of the reproduced coded speech signal with reference to the perceptually weighted speech signal;
      (a2h) minimum error detection means for finding a minimum error point that yields the smallest error among those that said error calculation means has calculated while varying the lag parameter; and
      (a2i) optimal value transmission means for transmitting optimal values including optimal filter coefficients and an optimal delay, the optimal filter coefficients being the filter coefficients at the minimum error point, the optimal lag being the lag parameter at the minimum error point.

18. A speech processing method which performs speech analysis and synthesis based on a speech production model, the method comprising the steps of:
   providing an adaptive codebook which stores a series of signal vectors of a past speech signal;
   producing coded data by coding a speech signal when at most one periodic component is contained in a fixed-length segment of the speech signal;
   extracting a signal vector and neighboring vectors adjacent thereto from the adaptive codebook for use in such cases where the fixed-length segment contains a plurality of periodic components, the signal vector being stored at a distance given by a lag parameter from the top entry location of the adaptive codebook;
   producing a long-term predicted speech signal from the signal vector and the neighboring vectors by using a long-term prediction synthesis filter with a high order to apply long-term prediction synthesis concerning the periodicity of the speech signal;
   calculating filter coefficients of the long-term prediction synthesis filter;
   obtaining a reproduced coded speech signal from the long-term predicted speech signal through combined use of a linear predictive synthesis filter defined through estimation with a linear predictive coding synthesis technique that emulates a vocal tract response and a perceptual weighting filter which assigns perceptual weights according to characteristics of a human hearing system;
   calculating an error of the reproduced coded speech signal with reference to the speech signal;
   finding a minimum error point that yields the smallest error among those that said step of calculating the error has calculated for various values of the lag parameter;
   transmitting optimal values including optimal filter coefficients and an optimal delay which are the filter coefficients and the lag parameter at the minimum error point; and
   reproducing the speech signal by decoding the coded data or the optimal values.

19. A speech coding processor, comprising:
   first speech coding means for coding a given speech signal with an adaptive codebook and a noise codebook when a frame of the speech signal contains at most one periodic component; and
   second speech coding means for coding the speech signal with the adaptive codebook and a long-term prediction synthesis filter when a frame of the speech signal contains a plurality of periodic components.

20. A speech decoding processor, comprising:
   first speech decoding means for reproducing a speech signal by decoding coded speech data thereof, based on a lag parameter, a noise codebook index, a gain index, and linear predictive coding coefficients which are included in the coded speech data;
   second speech decoding means for reproducing the speech signal by decoding the coded speech data, based on the lag parameter, long-term prediction synthesis filter coefficients, and linear predictive coding coefficients which are included the coded speech data; and selection means for selectively activating either said first speech decoding means or second speech decoding means, based on a mode of the coded speech data.

21. A speech decoding processor, comprising:

first speech decoding means for reproducing a speech signal by decoding coded speech data thereof when a fixed-length segment of the speech signal contains at most one periodic component; and second speech decoding means for reproducing the speech signal when the fixed-length segment contains a plurality of periodic components, by extracting from an adaptive codebook a signal vector that is stored at a distance given by a lag parameter from a top entry location of the adaptive codebook, along with neighboring vectors adjacent to the signal vector, producing a long-term predicted speech signal by subjecting the extracted signal vector and neighboring vectors to a high-order long-term prediction synthesis filter, and subjecting the produced long-term predicted speech signal to a linear predictive synthesis filter.

* * * * *